(12) United States Patent
Pushparaj et al.

(10) Patent No.: US 9,105,921 B2
(45) Date of Patent: Aug. 11, 2015

(54) POROUS AMORPHOUS SILICON—CARBON NANOTUBE COMPOSITE BASED ELECTRODES FOR BATTERY APPLICATIONS

(71) Applicant: APPLIED MATERIALS, INC., Santa Clara, CA (US)

(72) Inventors: Victor L. Pushparaj, Sunnyvale, CA (US); Omkaram Nalamasu, San Jose, CA (US); Steven Verhaverbeke, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/016,879

(22) Filed: Sep. 3, 2013

(65) Prior Publication Data
US 2014/0072876 A1 Mar. 13, 2014

Related U.S. Application Data

(62) Division of application No. 12/868,230, filed on Aug. 25, 2010, now Pat. No. 8,526,167.

(60) Provisional application No. 61/239,515, filed on Sep. 3, 2009.

(51) Int. Cl.
*H01G 11/36* (2013.01)
*H01M 4/1395* (2010.01)
(Continued)

(52) U.S. Cl.
CPC ............... *H01M 4/364* (2013.01); *C23C 16/24* (2013.01); *C23C 16/44* (2013.01); *C23C 16/54* (2013.01); *C23C 28/00* (2013.01); *C25D 11/005* (2013.01); *C25D 11/32* (2013.01); *H01G 11/28* (2013.01);
(Continued)

(58) Field of Classification Search
None
See application file for complete search history.

(56) References Cited

U.S. PATENT DOCUMENTS

| 6,613,603 B1 | 9/2003 | Sano |
| 6,723,140 B2 | 4/2004 | Chu et al. |

(Continued)

FOREIGN PATENT DOCUMENTS

| JP | AH11194134 | 7/1999 |
| JP | A2000192295 | 7/2000 |

(Continued)

OTHER PUBLICATIONS

Notice of Grant for Chinese Application No. 201080049787.0 dated Jul. 3, 2014.

(Continued)

*Primary Examiner* — Patrick Ryan
*Assistant Examiner* — Christopher Domone
(74) *Attorney, Agent, or Firm* — Patterson & Sheridan, LLP

(57) ABSTRACT

Embodiments of the present invention generally relate to methods and apparatus for forming an energy storage device. More particularly, embodiments described herein relate to methods of forming electric batteries and electrochemical capacitors. In one embodiment a method of forming a high surface area electrode for use in an energy storage device is provided. The method comprises forming an amorphous silicon layer on a current collector having a conductive surface, immersing the amorphous silicon layer in an electrolytic solution to form a series of interconnected pores in the amorphous silicon layer, and forming carbon nanotubes within the series of interconnected pores of the amorphous silicon layer.

16 Claims, 17 Drawing Sheets

(51) Int. Cl.

| | |
|---|---|
| *H01M 4/1393* | (2010.01) |
| *H01M 4/36* | (2006.01) |
| *C23C 16/24* | (2006.01) |
| *C23C 16/44* | (2006.01) |
| *C23C 16/54* | (2006.01) |
| *C23C 28/00* | (2006.01) |
| *C25D 11/32* | (2006.01) |
| *H01G 11/86* | (2013.01) |
| *H01L 21/67* | (2006.01) |
| *H01L 21/677* | (2006.01) |
| *H01M 4/04* | (2006.01) |
| *H01M 4/133* | (2010.01) |
| *H01M 4/134* | (2010.01) |
| *H01M 4/38* | (2006.01) |
| *H01M 4/587* | (2010.01) |
| *H01M 10/0525* | (2010.01) |
| *H01G 11/28* | (2013.01) |
| *C25D 11/00* | (2006.01) |
| *H01M 4/66* | (2006.01) |
| *B82Y 99/00* | (2011.01) |

(52) U.S. Cl.
CPC .............. *H01G 11/36* (2013.01); *H01G 11/86* (2013.01); *H01L 21/6776* (2013.01); *H01L 21/67173* (2013.01); *H01L 21/67184* (2013.01); *H01M 4/0428* (2013.01); *H01M 4/0438* (2013.01); *H01M 4/0442* (2013.01); *H01M 4/0492* (2013.01); *H01M 4/133* (2013.01); *H01M 4/134* (2013.01); *H01M 4/1393* (2013.01); *H01M 4/1395* (2013.01); *H01M 4/366* (2013.01); *H01M 4/38* (2013.01); *H01M 4/587* (2013.01); *H01M 10/0525* (2013.01); *B82Y 99/00* (2013.01); *H01M 4/661* (2013.01); *Y02E 60/122* (2013.01); *Y02E 60/13* (2013.01); *Y10T 29/41* (2015.01); *Y10T 29/417* (2015.01)

(56) References Cited

U.S. PATENT DOCUMENTS

| | | | |
|---|---|---|---|
| 6,737,197 B2 | 5/2004 | Chu et al. | |
| 6,824,755 B2 | 11/2004 | Colbert et al. | |
| 7,070,632 B1 | 7/2006 | Visco et al. | |
| 7,160,531 B1 | 1/2007 | Jacques et al. | |
| 7,183,229 B2 | 2/2007 | Yamanaka | |
| 2004/0258997 A1 | 12/2004 | Utsugi et al. | |
| 2005/0118494 A1* | 6/2005 | Choi | 429/43 |
| 2006/0063074 A1 | 3/2006 | Jenson et al. | |
| 2006/0113193 A1 | 6/2006 | Rasmussen | |
| 2006/0185595 A1 | 8/2006 | Coll et al. | |
| 2007/0194467 A1 | 8/2007 | Yang et al. | |
| 2009/0008248 A1* | 1/2009 | Shimomura et al. | 204/403.14 |
| 2009/0029256 A1 | 1/2009 | Mah et al. | |
| 2009/0170001 A1* | 7/2009 | Roozeboom et al. | 429/225 |
| 2009/0176159 A1 | 7/2009 | Zhamu et al. | |
| 2009/0186276 A1 | 7/2009 | Zhamu et al. | |

FOREIGN PATENT DOCUMENTS

| | | |
|---|---|---|
| JP | A2002100280 | 4/2002 |
| JP | A2004115844 | 4/2004 |
| JP | A2004327330 | 11/2004 |
| JP | A2009032693 | 2/2009 |
| WO | WO-2007002376 A2 | 1/2007 |
| WO | 2007108050 A1 | 9/2007 |

OTHER PUBLICATIONS

Search Report and Office Action for Taiwan Application No. 99128913 dated Jul. 24, 2014.
Office Action and Search Report for Chinese Patent Application No. 201080049787.0 dated Mar. 5, 2014.
International Search Report and Written Opinion for International Application No. PCT/US2010/046822 dated May 31, 2011.
International Preliminary Report on Patentability for International Application No. PCT/US2010/046822 dated Mar. 6, 2012.
Office Action for U.S. Appl. No. 12/868,230 dated Oct. 2, 2012.
Notice of Allowance for U.S. Appl. No. 12/868,230 dated Apr. 29, 2013.
Morinobu Endo et al, Carbon Fibers and Carbon Nanotubes, Shinshu University, Nagano, Japan, Massachusetts Institute of Technology, pp. 1-19.
Weiqiang Han et al, Conversion of Nickel Coated Carbon Nanotubes to Diamond under High Pressure and High Temperature, Jpn. J. Appl. Phys. vol. 37 (1998) Part 2, No. 9A/B, Sep. 15, 1998, pp. L1085-L1086.
Qunqing Li et al, Coating of Carbon Nanotube with Nickel by Electroless Plating Method, Jpn. J. Appl. Phys. vol. 36 (1997), Part 2, No. 4B, Apr. 15, 1997, pp. L501-L503.
Kiu-Yuen Tse et al, Vertically Aligned Carbon Nanofibers Coupled with Organosilicon Electrolytes: Electrical Properties of a High-Stability Nanostructured Electrochemical Interface, Chem. Mater., 2007, 19, pp. 5734-5741.
Office Action for Japanese Patent Application No. 2012-527920 dated Feb. 18, 2014.
Dekker, "Carbon Nanotubes as Molecular Quantum Wires," American Institute of Physics, May 1999, Physics Today, pp. 22-28.

* cited by examiner

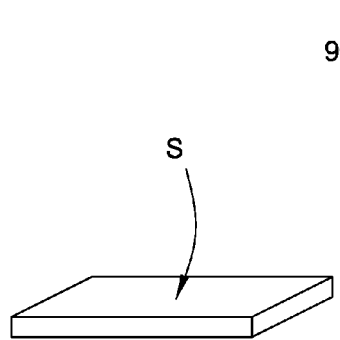
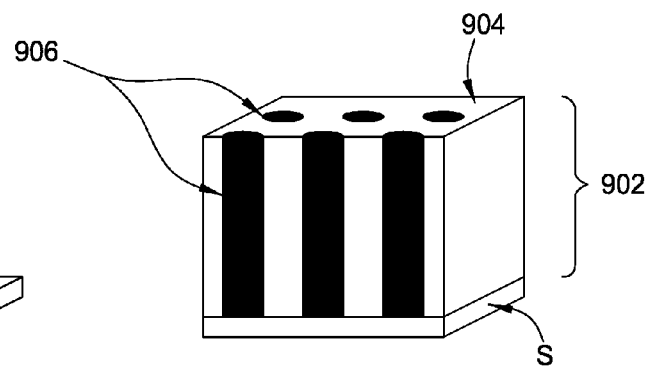
FIG. 9A  FIG. 9B
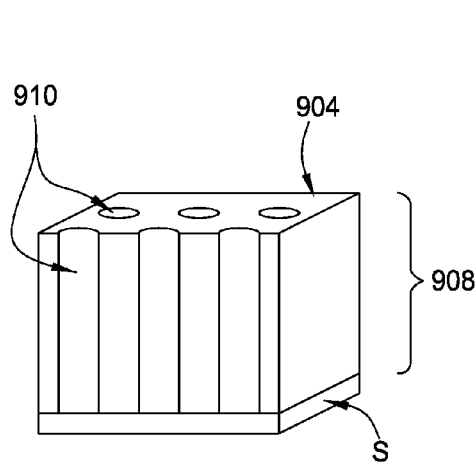
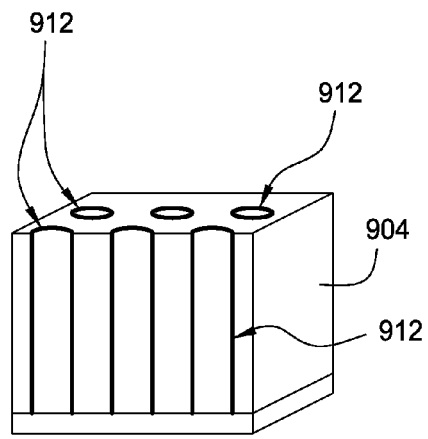
FIG. 9C  FIG. 9D

POROUS AMORPHOUS SILICON—CARBON NANOTUBE COMPOSITE BASED ELECTRODES FOR BATTERY APPLICATIONS

CROSS-REFERENCE TO RELATED APPLICATIONS

This application is a divisional of co-pending U.S. patent application Ser. No. 12/868,230, filed Aug. 25, 2010, granted as U.S. Pat. No. 8,526,167, Sep. 3, 2013, which claims benefit of U.S. provisional patent application Ser. No. 61/239,515, filed Sep. 3, 2009, both of which are herein incorporated by reference in their entirety.

BACKGROUND OF THE INVENTION

1. Field of the Invention

Embodiments of the present invention generally relate to methods of forming an energy storage device. More particularly, embodiments described herein relate to methods of forming electric batteries and electrochemical capacitors.

2. Description of the Related Art

Fast-charging, high-capacity energy storage devices, such as supercapacitors and lithium (Li+) ion batteries, are used in a growing number of applications, including portable electronics, medical, transportation, grid-connected large energy storage, renewable energy storage, and uninterruptible power supply (UPS) applications. In each of these applications, the charge time and capacity of energy storage devices are important parameters. In addition, the size, weight, and/or expense of such energy storage devices can be significant limitations. Further, low internal resistance is necessary for high performance. The lower the resistance, the less restriction the energy storage device encounters in delivering electrical energy. For example, in the case of super capacitors, lower internal resistance allows faster and more efficient charging and discharging thereof. In the case of a battery, internal resistance in a battery impacts performance by reducing the total amount of useful energy stored by the battery as well as the ability of the battery to deliver the high current pulses demanded by digital devices.

Accordingly, there is a need in the art for faster charging, higher capacity energy storage devices that are smaller, lighter, have a longer cycle life, and can be more cost effectively manufactured. There is also a need in the art for components for an electrical storage device that reduce the internal resistance of the storage device.

SUMMARY OF THE INVENTION

Embodiments of the present invention generally relate to methods of forming an energy storage device. More particularly, embodiments described herein relate to methods of forming electric batteries and electrochemical capacitors. In one embodiment a high surface area electrode for use in an electrochemical device is provided. The high surface area electrode comprises a substrate having a conductive surface, a porous amorphous silicon layer on the conductive surface of the substrate, wherein the porous amorphous silicon layer has a series of interconnected pores, and carbon nanotubes embedded within the series of interconnected pores of the amorphous silicon layer.

In another embodiment, a high surface area electrode for use in an energy storage device is provided. The high surface area electrode comprises a substrate having a conductive surface and a porous amorphous silicon carbon nanotube composite based material deposited on the conductive surface. The porous amorphous silicon carbon nanotube composite based material deposited on the conductive surface comprises a porous amorphous silicon layer formed on the conductive surface of the substrate, wherein the porous amorphous silicon layer has a series of interconnected pores and carbon nanotubes embedded within the series of interconnected pores of the porous amorphous silicon layer.

In yet another embodiment, a method of forming a high surface area electrode for use in an energy storage device is provided. The method comprises forming an amorphous silicon layer on a current collector having a conductive surface, immersing the amorphous silicon layer in an electrolytic solution to form a series of interconnected pores in the amorphous silicon layer, and forming carbon nanotubes within the series of interconnected pores of the amorphous silicon layer.

In yet another embodiment a method of fabricating a high surface area electrode is provided. The method comprises depositing an aluminum silicon matrix on a substrate, removing the aluminum from the silicon matrix to form a porous silicon layer having a plurality of pores, and growing carbon nanotubes in the plurality of pores in the porous silicon layer to form a silicon carbon nanotube matrix.

In yet another embodiment, an apparatus for fabricating a high surface area electrode, comprising a first end, a second end, at least one web of material extending from the first end to the second end, a support system to support the at least one web of material from the first end to the second end, and a plurality of chambers disposed between the first and the second end, the plurality of chambers being adapted and configured to form the high surface area electrode on the at least one web of material, wherein the at least one web of material extends through the plurality of chambers.

In yet another embodiment, an apparatus for forming an energy storage device on a substrate comprising at least one continuous web of conductive material is provided. The apparatus comprises a first end, a second end, a support system to support the at least one continuous web of conductive material extending from the first end to the second end, a first chamber disposed between the first and the second end for depositing an amorphous silicon layer on the at least one continuous web of conductive material, wherein the first chamber comprises, and a second chamber disposed between the first end and the second end for exposing the amorphous silicon layer to an anodization process, wherein the second chamber, comprises. The first chamber comprises a hot filament adapted to be heated at a surface temperature higher than 1,500° C., a showerhead that is adapted to deliver a silicon containing gas to form the amorphous silicon layer on the at least one continuous web of conductive material using a hot wire chemical vapor deposition (HWCVD) process, and a silicon containing gas source coupled with the showerhead for delivery of the silicon containing gas to the showerhead. The second chamber comprises a processing volume adapted to hold an electrolytic solution, an anode assembly disposed in the electrolytic solution, wherein the anode assembly is movable to contact the substrate and anodically bias the substrate, a cathode assembly disposed in the electrolytic solution, one or more inlet jets configured to dispense the electrolytic solution into the processing volume, and a power supply adapted to deliver power to the anode assembly and the cathode assembly such that the amorphous silicon layer is anodized to form an interconnected porous amorphous silicon layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 9A-9D are schematic isometric views of one embodiment of a high surface area electrode formed in accordance with embodiments described herein;

DETAILED DESCRIPTION

Figure 1:
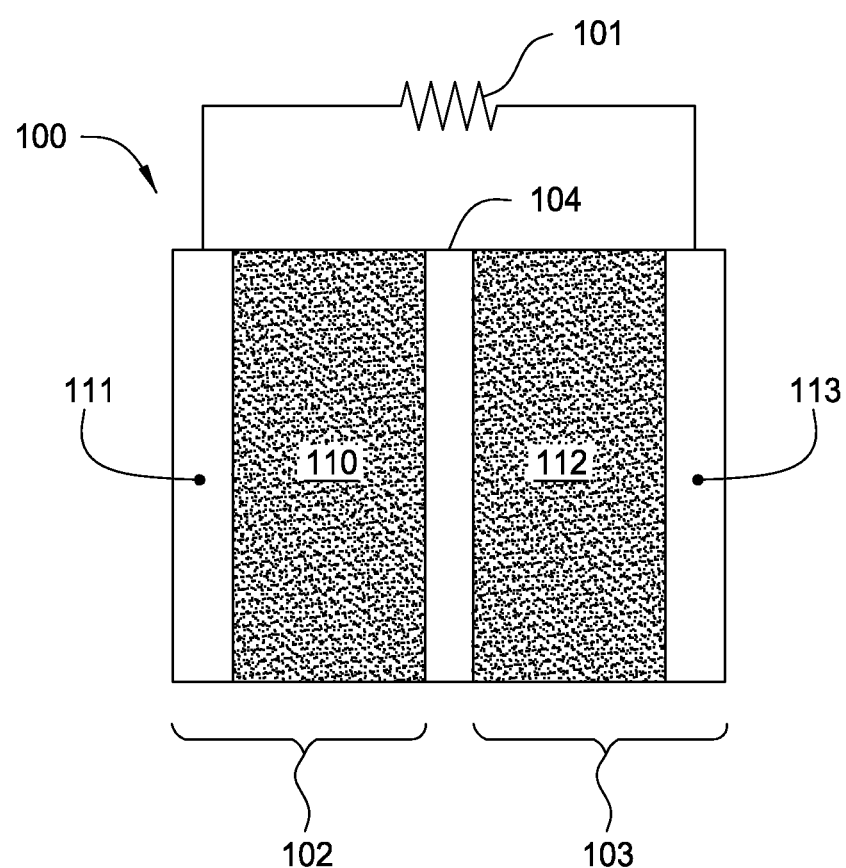
FIG. 1 is a schematic diagram of one embodiment of a Li-ion battery electrically connected to a load.

Embodiments of the present invention generally relate to methods of forming an energy storage device. More particularly, embodiments described herein relate to methods of forming electric batteries and electrochemical capacitors. In one embodiment, a composite electrode comprising carbon or carbon nanotubes deposited in the pores of an amorphous silicon thin film is provided for use in Li-ion battery systems.

In one embodiment, amorphous silicon is deposited on a substrate of interest (e.g., silicon, semiconductor wafer, stainless steel, or oxides) using chemical vapor deposition (CVD) techniques, such as plasma enhanced chemical vapor deposition (PECVD), or hot-wire chemical vapor deposition (HWCVD) technique at low temperatures. In another embodiment, instead of depositing amorphous silicon, a nanocrystalline/polycrystalline silicon wafer may be bombarded with ions to from amorphous silicon. In one embodiment, the amorphous silicon thin film is anodized to form pores in the amorphous silicon thin film. In one embodiment, the anodization is carried out in an electrochemical bath. In one embodiment, the electrochemical bath comprises hydrofluoric acid (HF) and acetic acid. In one embodiment, the electrochemical bath comprises 50% HF(49%)/50% acetic acid (glacial). In one embodiment, the anodization process if performed at room temperature at current densities between 20 mA/cm$^2$ and 100 mA/cm$^2$.

In one embodiment, the pore size is uniform. In another embodiment, the size of the pores is varied by varying the voltage applied during the anodization process. In one embodiment, the size of the pores formed in the anodization process is varied from 20 nm to 1,000 nm by changing the current density resulting in either through pores or inter-networked pores in the amorphous silicon structure.

In one embodiment, carbon nanotubes (CNTs) are formed in the pores using CVD processes. In one embodiment, the temperature during the CVD deposition of the CNTs is varied between about 500° C. and about 800° C. using different carbon source precursors such as methane, acetylene, xylene, and octane. In one embodiment, the final electrode structure has a current collector with the porous amorphous silicon and CNTs embedded or grown in the pores of the amorphous silicon. The amorphous silicon helps in the higher energy density when it interacts with Li ions while the intercalation of Li ion will help in increasing the cyclability and power density.

While the particular apparatus in which the embodiments described herein can be practiced is not limited, it is particularly beneficial to practice the embodiments in a cluster tool system or a web-based roll-to-roll system sold by Applied Materials, Inc., Santa Clara, Calif. Exemplary roll-to-roll and discrete substrate systems on which the embodiments described herein may be practiced are described in further detail in commonly assigned U.S. Provisional Patent Application Ser. No. 61/243,813, filed Sep. 18, 2009, titled APPARATUS AND METHODS FOR FORMING ENERGY STORAGE OR PV DEVICES IN A LINEAR SYSTEM, which is herein incorporated by reference in its entirety.

FIG. 1 is a schematic diagram of one embodiment of a Li-ion battery 100 electrically connected to a load 101, according to embodiments described herein. The primary functional components of Li-ion battery 100 include an anode structure 102, a cathode structure 103, a separator layer 104, and an electrolyte (not shown) disposed within the region between the opposing current collectors 111 and 113. A variety of materials may be used as the electrolyte, such as lithium salts in an organic solvent. The electrolyte is contained in anode structure 102, cathode structure 103, and a fluid-permeable separator layer 104 in the region formed between the current collectors 111 and 113.

The anode structure 102 and the cathode structure 103 each serve as a half-cell of the Li-ion battery 100 and together form a complete working cell of the Li-ion battery 100. The anode structure 102 includes a current collector 111 and a porous amorphous silicon carbon nanotube composite based material 110 that acts as a carbon-based intercalation host material for retaining lithium ions. Similarly, cathode structure 103 includes a current collector 113 and an intercalation host material 112 for retaining lithium ions, such as a metal oxide. Separator layer 104 is a dielectric, porous, fluid-permeable layer that prevents direct electrical contact between the components in the anode structure 102 and the cathode structure 103. Methods of forming Li-ion battery 100, as well as the materials that make up the constituent parts of Li-ion battery 100, i.e., anode structure 102, cathode structure 103, and separator layer 104, are described below.

Rather than the traditional redox galvanic action of a conventional secondary cell, Li-ion secondary cell chemistry depends on a fully reversible intercalation mechanism, in which lithium ions are inserted into the crystalline lattice of an intercalation host material in each electrode without changing the crystal structure of the intercalation host material. Thus, it is necessary for such intercalation host materials in the electrodes of a Li-ion battery to have open crystal structures that allow the insertion or extraction of lithium ions and have the ability to accept compensating electrons at the same time. In Li-ion battery 100, the anode, or negative electrode, is based on carbon, i.e., the porous amorphous silicon carbon nanotube composite based material 110. The cathode, or positive electrode, is made from a metal oxide, such as lithium cobalt dioxide ($LiCoO_2$) or lithium manganese dioxide ($LiMnO_2$). The cathode may be made from a layered oxide, such as lithium cobalt oxide, a polyanion, such as lithium iron phosphate, a spinel, such as lithium manganese oxide, or $TiS_2$ (titanium disulfide). Exemplary oxides may be layered lithium cobalt oxide, or mixed metal oxide, such as $LiNi_xCo_{1-2x}MnO_2$, $LiMn_2O_4$. Exemplary phosphates may be iron olivine ($LiFePO_4$) and it is variants (such as $LiFe_{1-x}MgPO_4$), $LiMoPO_4$, $LiCoPO_4$, $Li_3V_2(PO_4)_3$, $LiVOPO_4$, $LiMP_2O_7$, or $LiFe_{1.5}P_2O_7$. Exemplary fluorophosphates may be $LiVPO_4F$, $LiAlPO_4F$, $Li_5V(PO_4)_2F_2$, $Li_5Cr(PO_4)_2F_2$, $Li_2CoPO_4F$, $Li_2NiPO_4F$, or $Na_5V_2(PO_4)_2F_3$. Exemplary silicates may be $Li_2FeSiO_4$, $Li_2MnSiO_4$, or $Li_2VOSiO_4$.

The separator layer 104 is configured to supply ion channels for movement between the anode structure 102 from the cathode structure 103 while keeping the anode structure 102 and the cathode structure 103 physically separated to avoid a short. In one embodiment, the separator layer 104 may be deposited onto the surface of the porous amorphous silicon carbon nanotube composite based material 110 and may be a solid polymer, such as polyolefin, polypropylene, polyethylene, and combinations thereof.

In operation, Li-ion battery 100 provides electrical energy, i.e., energy is discharged, when the anode structure 102 and the cathode structure 103 are electrically coupled to load 101, as shown in FIG. 1. Electrons originating from the porous amorphous silicon carbon nanotube composite based material 110 flow from the current collector 111 of the anode structure 102 through the load 101 and the current collector 113 to the intercalation host material 112 of the cathode structure 103. Concurrently, lithium ions are dissociated, or extracted, from the porous amorphous silicon carbon nanotube composite based material 110 of the anode structure 102, and move through the separator layer 104 into the intercalation host material 112 of the cathode structure 103 and are inserted into the crystal structure of the intercalation host material 112. The electrolyte, which resides in the porous amorphous silicon carbon nanotube composite based material 110, intercalation host material 112, and the separator layer 104, allows the movement of lithium ions from the porous amorphous silicon carbon nanotube composite based material 110 to the intercalation host material 112 via ionic conduction. The Li-ion battery 100 is charged by electrically coupling an electromotive force of an appropriate polarity to the anode structure 102 and the cathode structure 103 in lieu of the load 101. Electrons then flow from the current collector 113 of the cathode structure 103 to the current collector 111 of the anode structure 102, and lithium ions move from the intercalation host material 112 in the cathode structure 103, through the separator layer 104, and into the mesoporous carbon material 110 of the anode structure 102. Thus, lithium ions are intercalated into the cathode structure 103 when Li-ion battery 100 is discharged and into the anode structure 102 when the Li-ion battery 100 is in the charged state.

Figure 2A:
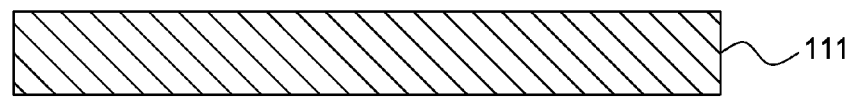
FIGS. 2A-2D are schematic cross-sectional views of one embodiment of a high surface area electrode formed in accordance with embodiments described herein.

FIGS. 2A-2D are schematic cross-sectional views of a high surface area electrode 200 formed in accordance with embodiments described herein. In FIG. 2A, the current collector 111 is schematically illustrated prior to the formation of the porous amorphous silicon carbon nanotube composite based material 110. The current collector 111 may include a relatively thin conductive layer disposed on a host substrate, or simply a conductive substrate (e.g., foil, sheet, plate), comprising one or more conductive materials, such as a metal, plastic, graphite, polymers, carbon-containing polymer, composites, or other suitable materials. Examples of metals that the current collector 111 may be comprised of include copper (Cu), zinc (Zn), nickel (Ni), cobalt (Co), palladium (Pd), platinum (Pt), tin (Sn), ruthenium (Ru), stainless steel, alloys thereof, and combinations thereof. In one embodiment, the current collector 111 is a metallic foil and may have an insulating coating disposed thereon. Alternatively, the current collector 111 may comprise a host substrate that is non-conductive, such as a glass, silicon, plastic, or polymeric substrate that has an electrically conductive layer formed thereon by means known in the art, including physical vapor deposition (PVD), electrochemical plating (ECP), electroless plating, and the like. In one embodiment, the current collector 111 is formed out of a flexible host substrate. The flexible host substrate may be a lightweight and inexpensive plastic material, such as polyethylene, polypropylene or other suitable plastic or polymeric material, with a conductive layer formed thereon. Materials suitable for use as such a flexible substrate include a polyimide (e.g., KAPTON™ by DuPont Corporation), polyethyleneterephthalate (PET), polyacrylates, polycarbonate, silicone, epoxy resins, silicone-functionalized epoxy resins, polyester (e.g., MYLAR™ by E.I. du Pont de Nemours & Co.), APICAL AV manufactured by Kanegaftigi Chemical Industry Company, UPILEX manufactured by UBE Industries, Ltd.; polyethersulfones (PES) manufactured by Sumitomo, a polyetherimide (e.g., ULTEM by General Electric Company), and polyethylenenaphthalene (PEN). Alternately, the flexible substrate may be constructed from a relatively thin glass that is reinforced with a polymeric coating.

Figure 2B:
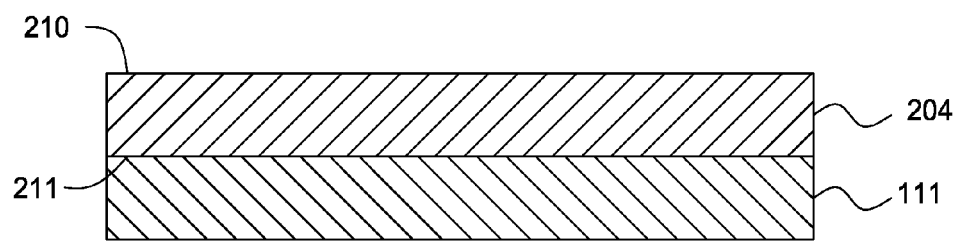

In FIG. 2B, an amorphous silicon layer 204 is formed over the current collector 111. In one embodiment, the amorphous silicon layer 204 has a thickness from about 100 nm to about 3 μm. In one embodiment, the amorphous silicon layer 204 has a thickness from about 500 nm to about 2 μm. In one embodiment, the amorphous silicon layer has a thickness from about 700 nm to about 1000 nm. In one embodiment, the amorphous silicon layer 204 is deposited using a chemical vapor deposition process such as plasma enhanced chemical vapor deposition (PECVD) or hot-wire chemical vapor deposition (HWCVD). In one embodiment a nanocrystalline/polycrystalline layer is formed over the current collector 111 and subsequently bombarded with ions to form the amorphous silicon layer 204.

Figure 2C:
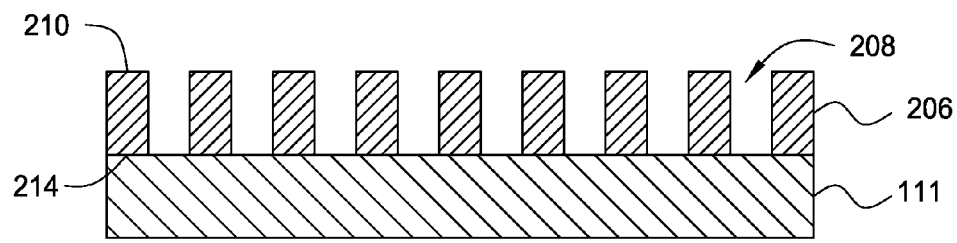

In FIG. 2C, a porous amorphous silicon layer 206 is formed over the current collector 111. In one embodiment, the porous amorphous silicon layer 206 is formed by exposing the amorphous silicon layer 204 to an anodization process to form interconnected pores 208. In one embodiment, each of the interconnected pores 208 has a diameter from about 20 nm to about 1,000 nm. In one embodiment, each of the interconnected pores has a diameter from about 100 nm to about 500 nm. In one embodiment, each of the interconnected pores has a diameter from about 100 nm to about 200 nm. In one embodiment, each of the interconnected pores has a diameter from about 30 nm to about 50 nm. In one embodiment, the interconnected pores 208 are through pores extending from a top surface 210 of the porous amorphous silicon layer 206 to a bottom surface 211 of the porous amorphous silicon layer 206 exposing a top surface 214 of the current collector 111. In one embodiment, the interconnected pores 208 extend from the top surface 210 of the porous amorphous silicon layer 206 stopping at a distance from the bottom surface 211 of the porous amorphous silicon layer 206. In one embodiment, the interconnected pores 208 extend from the top surface 210 of the porous amorphous silicon layer 206 to from about 10 nm to about 200 nm from the bottom surface 211 of the porous amorphous silicon layer 206. In one embodiment the diameter of the pore 208 may vary along the length of the pore 208. In one embodiment, the diameter of the pore decreases along the length of the pore 208 from the top surface 210 of the porous amorphous silicon layer 206 to the bottom surface 211 of the porous amorphous silicon layer 206. In one embodiment, the diameter of the pore increases along the length of the pore 208. In one embodiment, the interconnected pores 208 comprise a series of interconnected branch structures having branches of varying lengths and diameters. In one embodiment, the diameter of the interconnected pores 208 decreases as the interconnected pores 208 extend downward from the top surface 210 of the porous amorphous silicon layer 206 toward the bottom surface 211 of the porous amorphous silicon layer 206. In one embodiment the length of each pore 208 is equivalent to the thickness of the film. In one embodiment, the length of each pore 208 is between about 0.5 microns and about 5 millimeters. In another embodiment, the length of each pore 208 is between about 100 microns and about 500 microns. In another embodiment, the length of each pore 208 is about 200 microns. In one embodiment, the porous amorphous silicon layer 206 may have a porosity that is between 50%-90% as compared to a solid film formed from the same material.

Figure 2D:
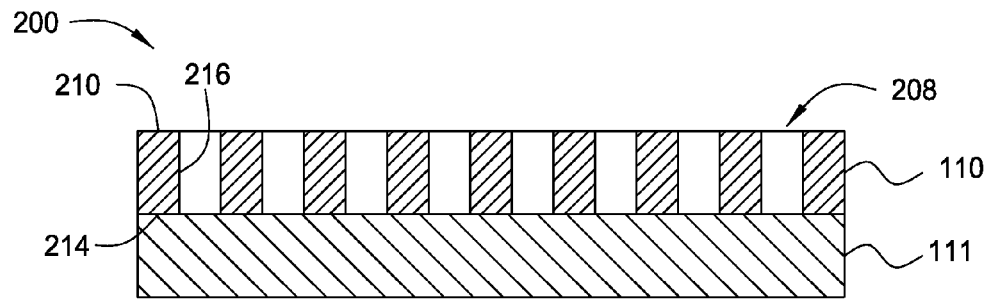

In FIG. 2D, a carbon structure such as carbon nanotubes are formed within the interconnected pores 208 to form the porous amorphous silicon carbon nanotube composite based material 110. In one embodiment, the carbon nanotubes are formed along the walls 216 of the interconnected pores 208. In one embodiment, the carbon nanotubes extend above the top surface 210 of the porous amorphous silicon carbon nanotube composite based material 110.

Figure 3:
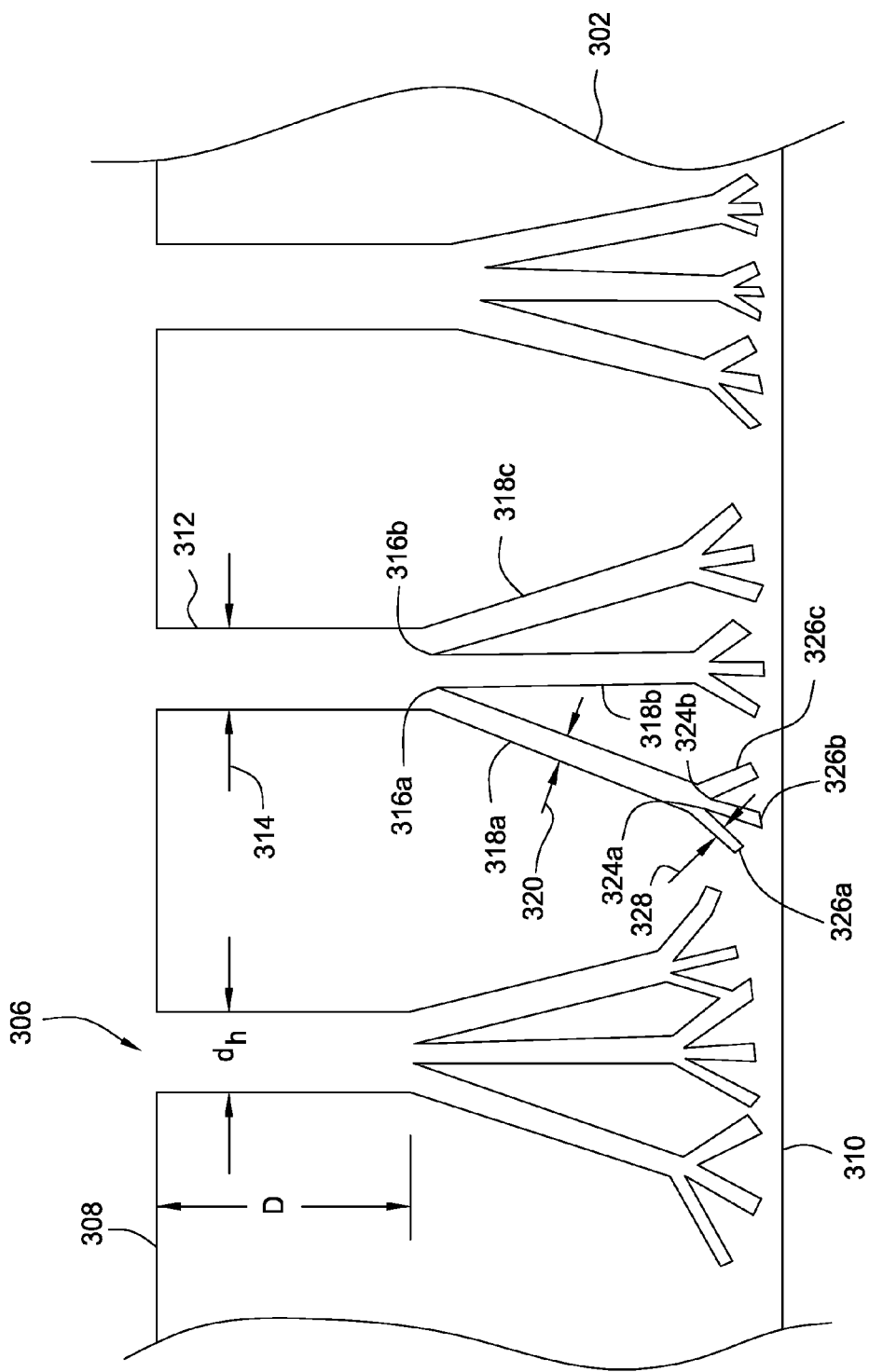
FIG. 3 is a schematic cross sectional view of one embodiment of an amorphous silicon layer having interconnected pores formed according to embodiments described herein.

FIG. 3 is a schematic cross sectional view of one embodiment of an amorphous silicon layer 302 having interconnected pores 306 formed according to embodiments described herein that may make up the porous amorphous silicon carbon nanotube composite based material 110. The amorphous silicon layer 302 has a top surface 308 and a bottom surface 310. The interconnected pores may comprise cylindrical holes, each hole having a diameter "$d_h$" which ranges from a few nanometers to hundreds of nanometers and a depth "D" which may range from a few micrometers to hundreds of micrometers. The series of interconnected pores 306 comprises a plurality of individual pores of varying lengths and diameters. In one embodiment, a first pore 312 extends from the top surface 308 and has a first diameter 314. In one embodiment, the first diameter is from about 500 nm to about 1000 nm. In one embodiment, the first diameter is from about 700 nm to about 900 nm.

The first pore 312 extends downward toward the bottom surface 310 forming first branch structures 316a, 316b. At the first branch structures 316a, 316b the first pore 312 splits into multiple pores 318a, 318b, 318c having a second diameter 320. In one embodiment, the second diameter is less than the first diameter 314. In one embodiment, the second diameter 320 is from about 200 nm to about 500 nm. In one embodiment, the second diameter 320 is from about 300 nm to about 400 nm. Although the first pore 312 is depicted as splitting into three pores 318a, 318b, 318c, it should be understood that the first pore 312 may split into any number of pores and each pore may having similar or different diameters.

Each of the multiple pores 318a, 318b, 318c, extends downward toward the bottom surface 310 forming a second branch structure 324a, 324b. At the second branch structure 324a, 324b each of the multiple pores 318a, 318b, 318c splits into multiple pores 326a, 326b, 326c having a third diameter 328. In one embodiment, the third diameter is less than the second diameter 320. In one embodiment, the third diameter is from about 20 nm to about 200 nm. In one embodiment, the third diameter is from about 50 nm to about 100 nm.

In one embodiment, the interconnected pores 306 are through pores extending from the top surface 308 of the amorphous silicon layer 302 to the bottom surface 310 of the amorphous silicon layer 302. In one embodiment, the interconnected pores 306 extend from the top surface 308 of the porous amorphous silicon layer 302 to an average distance 330 from the bottom surface 310 of the porous amorphous silicon layer 302. In one embodiment the average distance 330 is from about 10 nm to about 200 nm. In one embodiment, the average distance 330 is from about 50 nm to about 100 nm.

Figure 4:
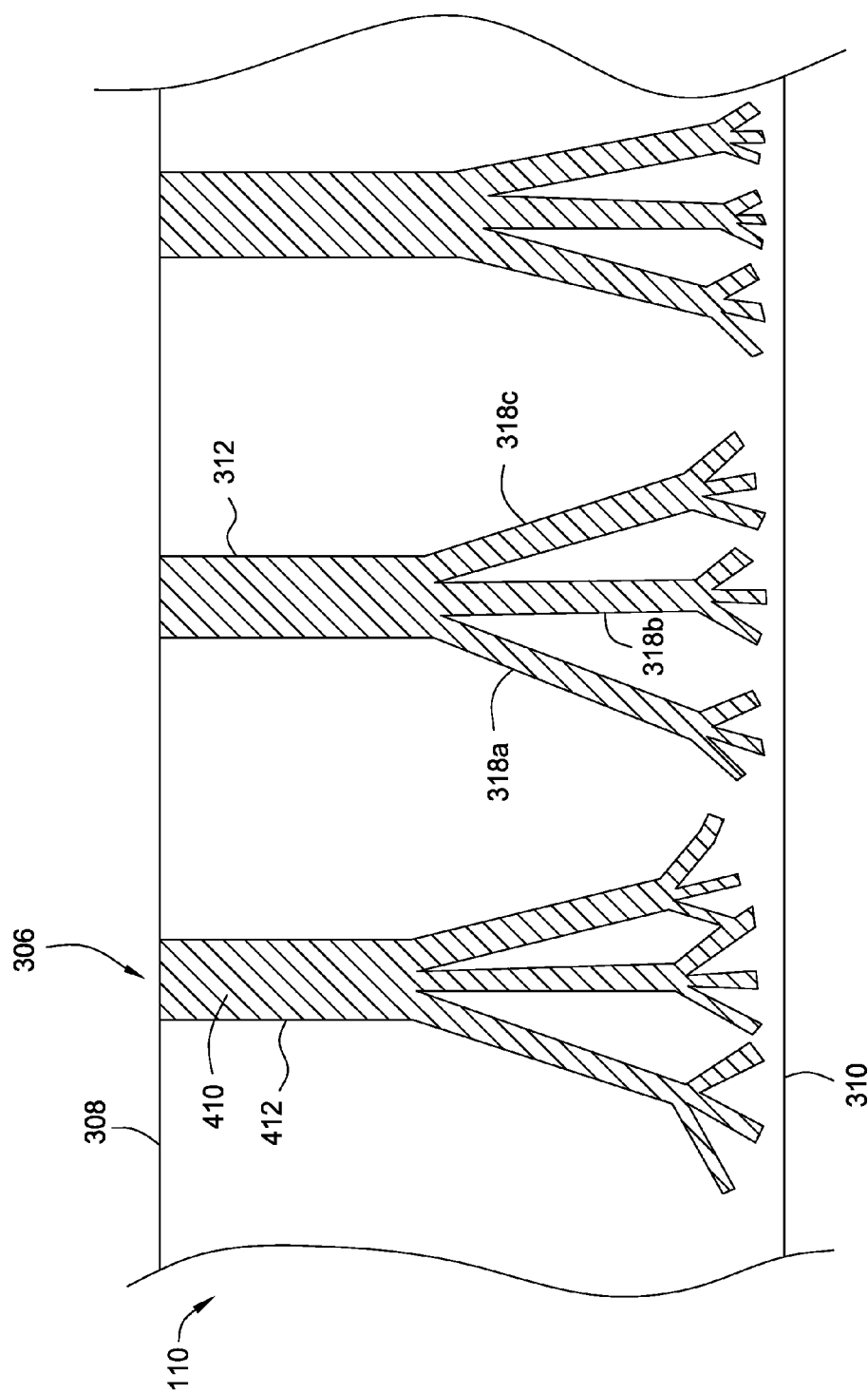
FIG. 4 is a schematic cross sectional view of one embodiment of a porous amorphous silicon carbon nanotube composite based material formed according to embodiments described herein.

FIG. 4 is a schematic cross sectional view of one embodiment of a porous amorphous silicon carbon nanotube composite based material 110 formed according to embodiments described herein. In one embodiment, carbon nanotubes 410 are formed within the interconnected pores 306 to form the porous amorphous silicon carbon nanotube composite based material 110. In one embodiment, the carbon nanotubes are formed along the walls 412 of the interconnected pores 306. In one embodiment, the carbon nanotubes extend above the top surface 308 of the porous amorphous silicon carbon nanotube composite based material 110. The carbon nanotubes 410 may have any orientation relative to each other. In one embodiment, the carbon nanotubes 410 may be perpendicular relative to each other. In another embodiment, the carbon nanotubes 410 may be parallel to each other. In one embodiment, there is one carbon nanotube per pore since the carbon deposits along the walls 412 of the pores 306.

The carbon nanotubes and/or carbon nanofibers are graphitic nanofilaments having diameters similar to that of the pore in which the nanotube is grown. For example, in embodiments where the interconnected pores 208 have a diameter from about 20 nm to about 1,000 nm, the carbon nanotube grown within the pore 208 would also have a diameter between about 20 nm to about 1,000 nm. In one embodiment, each of the carbon nanotubes has a diameter from about 100 nm to about 500 nm. In one embodiment, each of the carbon nanotubes has a diameter from about 100 nm to about 200 nm. In one embodiment, each of the carbon nanotubes has a diameter from about 30 nm to about 50 nm. In one embodiment, the carbon nanotubes and/or carbon nanofibers have a diameter between about 0.4 nanometers to about 100 nanometers and lengths which typically range from a few micrometers to a few millimeters. Graphitic nanofilaments may be categorized according to at least four distinct structural types, namely, tubular, herringbone, platelet, and ribbon. The term "nanotube" may be used to describe the tubular structure whereas "nanofiber" may describe the non-tubular forms.

Figures 5A, 5B:
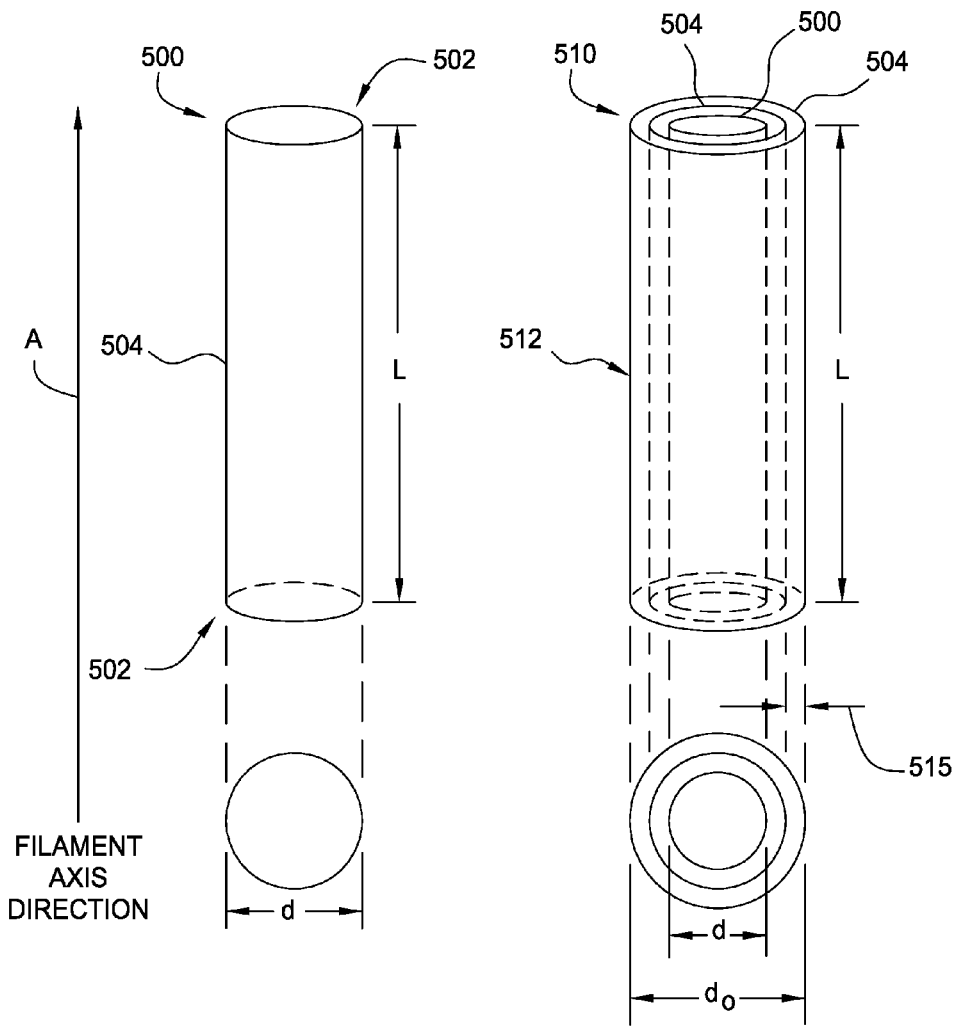
FIG. 5A is a schematic view of one embodiment of a single-walled carbon nanotube.
FIG. 5B is a schematic view of one embodiment of a multi-walled carbon nanotube.

Carbon nanotubes are generally classified as single-walled carbon nanotubes and multi-walled carbon nanotubes. FIG. 5A is a schematic view of a single-walled carbon nanotube (SWCNT). The SWCNT 500 is a graphitic nanofilament which comprises a cylindrical carbon molecule that may be conceptualized as a one-atom thick sheet of graphite called graphene rolled into a seamless graphene tube 504 of diameter "d" and filament length "L." The graphene tube 504 forms a cylindrical wall which is parallel to the filament axis direction. One or more of the nanotube ends 502 may be capped by additional carbon atoms. The diameter "d" may range from about 0.4 nanometers to a few nanometers and the filament length "L" may range from a few micrometers to a few millimeters, and the large length-to-diameter aspect ratio of the SWCNT 500 gives the nanotube a large surface area-to-volume ratio.

The rolled graphene layer or sheet of the SWCNT 500 comprises six-member hexagonal rings of carbon atoms held together by covalent $sp^2$ bonds and these bonds combined with the tubular graphene structure impart extraordinary strength (tensile strength) and stiffness (elastic modulus) to carbon nanotubes. The SWCNT 500, for example, may have an average tensile strength of about 30 GPa and an elastic modulus of about 1 TPa compared to stainless steel which may have a tensile strength of about 1 GPa and an elastic modulus of about 0.2 TPa. Carbon nanotubes also have a fairly low density for a solid (about 1.3 $g/cm^3$ for SWCNTs 500) and their strength-to-weight ratio is the highest of known materials. The electrical conductivity of the SWCNT 500 may be semiconducting or metallic depending upon how the graphene sheet is rolled to form the graphene tube 504, and metallic-type carbon nanotubes can carry electrical current densities orders of magnitude larger than those carried by the best conducting metals.

FIG. 5B is a schematic view of a multi-walled carbon nanotube (MWCNT). The MWCNT 510 may be conceptualized as one or more graphene tubes 504 of filament length "L" coaxially arranged about the SWCNT 500 of diameter "d." The graphene tubes 504 form cylindrical walls which are parallel to the filament axis direction "A" and the walls are separated from each other by an interlayer spacing 515 of about 0.34 nanometers which approximates the distance between graphene layers in graphite. The number of tubes (three are shown) or cylindrical walls within the MWCNT 510 may range from two to fifty, or more. An outer nanotube 512 has a filament diameter "$d_o$," which may range from a few nanometers to several hundred nanometers or more depending upon the number of walls within the MWCNT 510.

The term "carbon nanotube" is typically used to describe a nanofilament which comprises one or more graphene layers or sheets which are parallel to the filament axis and which form tubular structures. The term "carbon nanofiber," on the other hand, typically describes a nanofilament which comprises graphene layers which may or may not be parallel to the filament axis and which do not form tubular structures, although the structures may be formed so that the nanofibers are substantially round or polygonal in cross-section. Examples of nanofiber structures include herringbone, platelet, ribbon, stacked-cone, and other carbon nanofiber structures known in the art. Some nanofibers may have a hollow core or central hole along the filament axis of each nanofiber, while other nanofibers may have solid cores. The term "graphitic nanofilament" is used herein to refer to a carbon nanotube and/or carbon nanofiber. The graphitic nanofilaments may have overall shapes which include but are not limited to straight, branched, twisted, spiral, and helical. Exemplary carbon nanotube and nanofiber structures are described in commonly assigned U.S. patent application Ser. No. 12/634, 095, filed Dec. 9, 2009, titled THREE DIMENSIONAL BATTERY WITH HYBRID NANO-CARBON LAYER, which is incorporated by reference herein.

Figure 6:
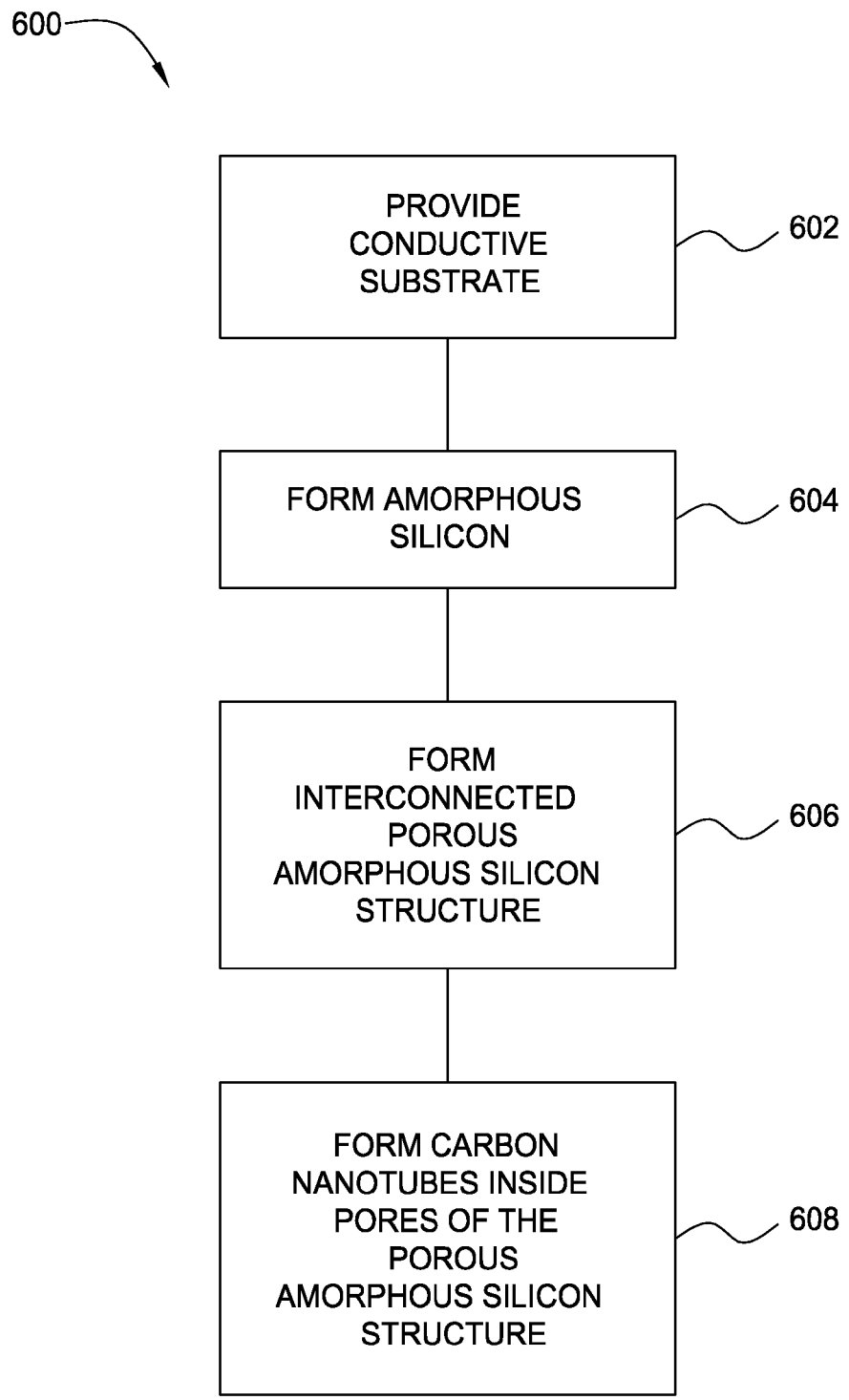
FIG. 6 is a process flow chart summarizing one embodiment of a method for forming a high surface area electrode according to embodiments described herein.

FIG. 6 is a process flow chart summarizing one embodiment of a method 600 for forming a high surface area electrode 200 according to one embodiment described herein. In block 602, a current collector similar to current collector 111 is provided. In one embodiment, the current collector may include a relatively thin conductive layer disposed on a host substrate, or simply a conductive substrate (e.g., foil, sheet, plate), comprising one or more conductive materials, such as a metal, plastic, graphite, polymers, carbon-containing polymer, composites, or other suitable materials. In one embodiment, the current collector is a metallic foil and may have an insulating coating disposed thereon. In one embodiment, the insulating coating may comprise an oxide containing layer such as a silicon oxide containing layer. Alternatively, the current collector may comprise a host substrate that is non-conductive, such as a glass, silicon, plastic, or polymeric substrate that has an electrically conductive layer formed thereon by means known in the art, including physical vapor deposition (PVD), electrochemical plating (ECP), electroless plating, and the like. In one embodiment, the current collector is formed out of a flexible host substrate.

In block 604, an amorphous silicon layer similar to amorphous silicon layer 204 is formed on the current collector. In one embodiment, the amorphous silicon layer is deposited using a chemical vapor deposition process known in the art such as plasma enhanced chemical vapor deposition (PECVD) or hot-wire chemical vapor deposition (HWCVD). In one embodiment the amorphous silicon layer is formed by depositing a nanocrystalline/polycrystalline layer over the current collector 111 and subsequently bombarding the nanocrystalline/polycrystalline layer to modify the ordered crystal structure forming an amorphous silicon structure.

In block 606, a porous amorphous silicon layer similar to the porous amorphous silicon layer 206 is formed by forming an interconnected porous structure in the amorphous silicon layer. In one embodiment, anodization techniques are used to form the interconnected porous structure in the amorphous silicon layer. The anodization techniques comprise immersing the current collector in an electrolytic solution. The electrolytic solution may be any acidic solution. Suitable acid solutions include, for example, inorganic acids such as sulfuric acid, phosphoric acid, pyrophosphoric acid, perchloric acid, acetic acid, citric acid, combinations thereof, as well as acid electrolyte derivatives, including ammonium and potassium salts thereof. In one embodiment, the electrolytic solution comprises a combination of 50% hydrofluoric acid and 50% acetic acid. Optionally, the electrolytic solution may include one or more additive compounds.

The interconnected pores are formed by passing a direct current through the electrolytic solution, with a metal electrode serving as the anode (the positive electrode) and the current collector 111 with the amorphous silicon layer 204 deposited thereon serving as the cathode (negative electrode). The current releases hydrogen at the cathode (the negative electrode) and oxygen at the surface of the anode. In one embodiment, alternating current may be used. In one embodiment, pulsed current may be used. The voltage required by various solutions may range from about 1 Volt to about 300 Volts DC. The anodizing current varies with the area of the current collector. In one embodiment, the anodizing current ranges from about 20 mA/cm$^2$ to about 100 mA/cm$^2$. In one embodiment the anodizing current ranges from about 50 mA/cm$^2$ to about 80 mA/cm$^2$. Conditions such as electrolyte concentration, acidity, solution temperature, and current may be varied to allow the formation of interconnected pores of varying sizes.

With reference to FIG. 3, the diameter of each of the interconnected pores 306 may be controlled by varying the voltage applied during the anodization process since pore diameter is proportions to the voltage applied. In one embodiment, a first voltage range is applied to form the first set of pores 312 having the first diameter 314 extending from the top surface 308. In one embodiment, the first voltage range is decreased to a second voltage range. As the first voltage range is decreased to the second voltage range, the first set of pores 312 splits into multiple pores 318a, 318b, 318c having a second diameter 320 less than the first diameter. In one embodiment, the second voltage range is decreased to a third voltage range. As the second voltage range is decreased to the third voltage range, each of the multiple pores 318a, 318b, 318c splits into multiple pores 326a, 326b, 326c having a third diameter 328 less than the second diameter 320. In one embodiment, after formation of the first pore 312 sequential reduction of the anodization voltage allows for further branching of the interconnected pores. In one embodiment, if the voltage is reduced gradually, the first pores divide gradually but if the voltage is decreased sharply, the first pores divide abruptly. In one embodiment, the anodization voltage for formation of the first pores 312 is between about 40 volts and about 100 volts. In one embodiment, the anodization voltage may be reduced by a factor of $1/\sqrt{n}$ where n is the number of branches formed. For example, reduction of the anodization voltage by a factor of $1/\sqrt{3}$ may be used for formation of multiple pores 318a, 318b, 318c.

The density, diameter, and alignment of the interconnected pores are controlled so that the density, diameter, and alignment of the graphitic nanofilaments may also be controlled. The interconnected pore density is the number of pores per unit area of the top surface of the porous amorphous silicon layer. In one embodiment, the interconnected pores may be aligned as desired relative to the top surface of the porous amorphous silicon layer.

In one embodiment, an endpoint for the anodization process is reached when the current collector 111 is exposed causing the current to spike. In embodiments where the interconnected pores are not through pores, the current spike may also be used to detect an endpoint prior to exposure of the underlying current collector 111 for the anodization process.

At block 608, graphitic nanofilaments such as carbon nanotubes or carbon nanofibers are formed inside the pores of the porous amorphous silicon structure. One desirable processing technique that can be used to form the carbon nanotubes is a chemical vapor deposition process (CVD). The chemical vapor deposition (CVD) techniques used to form carbon nanotubes may be generally categorized into two types: catalytic and non-catalytic. The methods which use catalyst materials to facilitate and help control the growth of carbon nanotubes are referred to as catalytic CVD methods. The methods which use no catalyst materials for carbon nanotube growth are referred to as non-catalytic or pyrolytic CVD methods since only heating, and not catalysis, typically drives nanofilament growth. The catalytic CVD methods often provide greater control over carbon nanotube growth than non-catalytic methods. Various methods of carbon nanotube growth are described by K. Teo et al., in "Catalytic Synthesis of Carbon Nanotubes and Nanofibers," Encyclopedia of Nanoscience and Nanotechnology, Volume X, pg. 1-22, American Scientific Publishers, 2003.

The graphitic nanofilament type (nanotube or nanofiber), structure (single-walled, multi-walled, herringbone, etc.), diameter, length and alignment may be controlled by controlling the CVD growth parameters. The growth parameters include but are not limited to carbon source gas, carrier gas, growth temperature, growth pressure, and growth time. For catalytic CVD growth, additional growth parameters may include catalyst parameters such as catalyst size, shape, composition, and catalyst precursors. The parameter ranges and options for catalytic CVD growth, excluding catalyst parameters, may, in general, be applicable to the non-catalytic CVD growth of graphitic nanofilaments, although higher temperatures may be used for the non-catalytic CVD methods.

Generally, the temperatures for the catalytic CVD growth of graphitic nanofilaments may range from about 300 degrees Celsius (° C.) to about 3000 degrees Celsius (° C.). In one embodiment, the temperatures for the catalytic CVD growth may range from about 600° C. to about 1200° C., although temperatures lower than 600° C. may be used, especially if the CVD growth is plasma enhanced. The growth pressures may range from about 0.1 Torr to about 1 atmosphere, but more preferably from about 0.1 Torr to about 100 Torr, although lower or higher pressures may also be used. In another embodiment, the growth pressures are above atmospheric pressure, and may range from about 1 atmosphere to about 10 atmospheres. The growth time or "residence time" depends in part on the desired graphitic nanofilament length, with longer growth times producing longer lengths. The growth time may range from about ten seconds to many hours, but more typically from about ten minutes to several hours. In one embodiment, the growth time is in a range between about 1 minute and about 5 minutes.

The carbon source gas used for graphitic nanofilament growth may include but is not limited to ethylene, propylene, acetylene, benzene, toluene, ethane, methane, butane, propane, hexane, methanol, ethanol, propanol, isopropanol, carbon monoxide, acetone, oxygenated hydrocarbons, low-molecular-weight hydrocarbons, high-molecular weight hydrocarbons or combinations thereof. In general, the carbon source gas may comprise any carbon-containing gas or gases, and the carbon source gas may be obtained from liquid or solid precursors for the carbon-containing gas or gases. An auxiliary gas may be used with the carbon source gas to facilitate the growth process. The auxiliary gas may comprise one or more gases, such as carrier gases, inert gases, reducing gases (e.g., hydrogen, ammonia), dilution gases, or combinations thereof, for example. The term "carrier gas" is sometimes used in the art to denote inert gases, reducing gases, and combinations thereof. Some examples of carrier gases are hydrogen, nitrogen, argon, and ammonia.

Suitable catalyst materials may include but are not limited to iron, cobalt, nickel, copper, silver, magnesium, ruthenium, rhodium, iridium, platinum, palladium, molybdenum, tungsten, chromium and alloys, oxides, and combinations thereof. Combinations or mixtures of catalyst materials which may be used include but are not limited to iron-nickel, iron-molybdenum, iron-cobalt, cobalt-nickel, and cobalt-molybdenum. Preferred catalysts include iron, cobalt, nickel and alloys thereof.

The graphitic nanofilaments are grown within the interconnected pores and the density, diameter, and alignment of the nanofilaments may closely reproduce the density, diameter, and alignment of the interconnected pores. Catalyst particles may be deposited within the interconnected pores 208 to enable catalytic nanofilament growth (either base-growth or tip-growth). Alternately, the growth of the graphitic nanofilaments within the nanopores may be non-catalytic (i.e., pyrolytic).

Figure 7A:
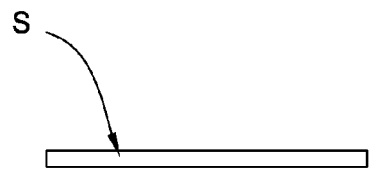
FIGS. 7A-7G are schematic cross-sectional views of one embodiment of a high surface area electrode formed in accordance with embodiments described herein.
Figure 7B:
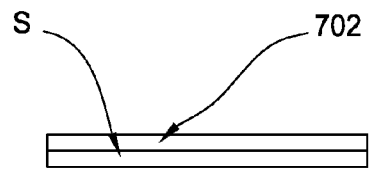

FIGS. 7A-7G are schematic cross-sectional views of one embodiment of a high surface area electrode formed in accordance with embodiments described herein. FIG. 8 is a process flow chart 800 summarizing one embodiment of a method for forming a high surface area electrode according to embodiments described herein. The sequence found in FIG. 8 corresponds to the stages depicted in FIGS. 7A-7G, which are discussed herein. The composite materials may be formed on discrete substrates S as shown in FIG. 7A or on a web in a roll-to-roll process. Such a substrate S is shown in FIG. 7A. The substrate S can be made of, but is not limited to: glass, silicon (Si) or metal such as aluminum (Al), stainless steel, or copper (Cu). In one embodiment, the substrate S may be relatively non-flexible when provided as a discrete substrate, but relatively flexible when supplied as a web (for example, aluminum, stainless steel, or copper foil). In another embodiment, the substrate may be flexible when provided as a discrete substrate.

At block 802, as shown in FIG. 7A, a substrate S is positioned in a processing region and a layer 702 of catalytic material is deposited on the substrate S. In one embodiment, the catalytic material of layer 702 comprises: iron (Fe); cobalt (Co); nickel (Ni); alloys thereof, polymers thereof, and combinations thereof. In one embodiment, the layer of catalytic material 702 may be deposited on the substrate S using a number of methods including a physical vapor deposition (PVD) method such as sputtering, or a chemical vapor deposition (CVD) method, as described above. In one embodiment, the layer of catalytic material 702 is deposited to a thickness of about 0.2 nm to about 20 nm. In one embodiment, the layer of catalytic material 702 is deposited to a thickness of less than about 20 nm.

Figure 7C:
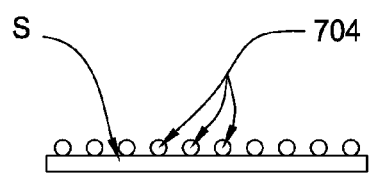
Figure 8:
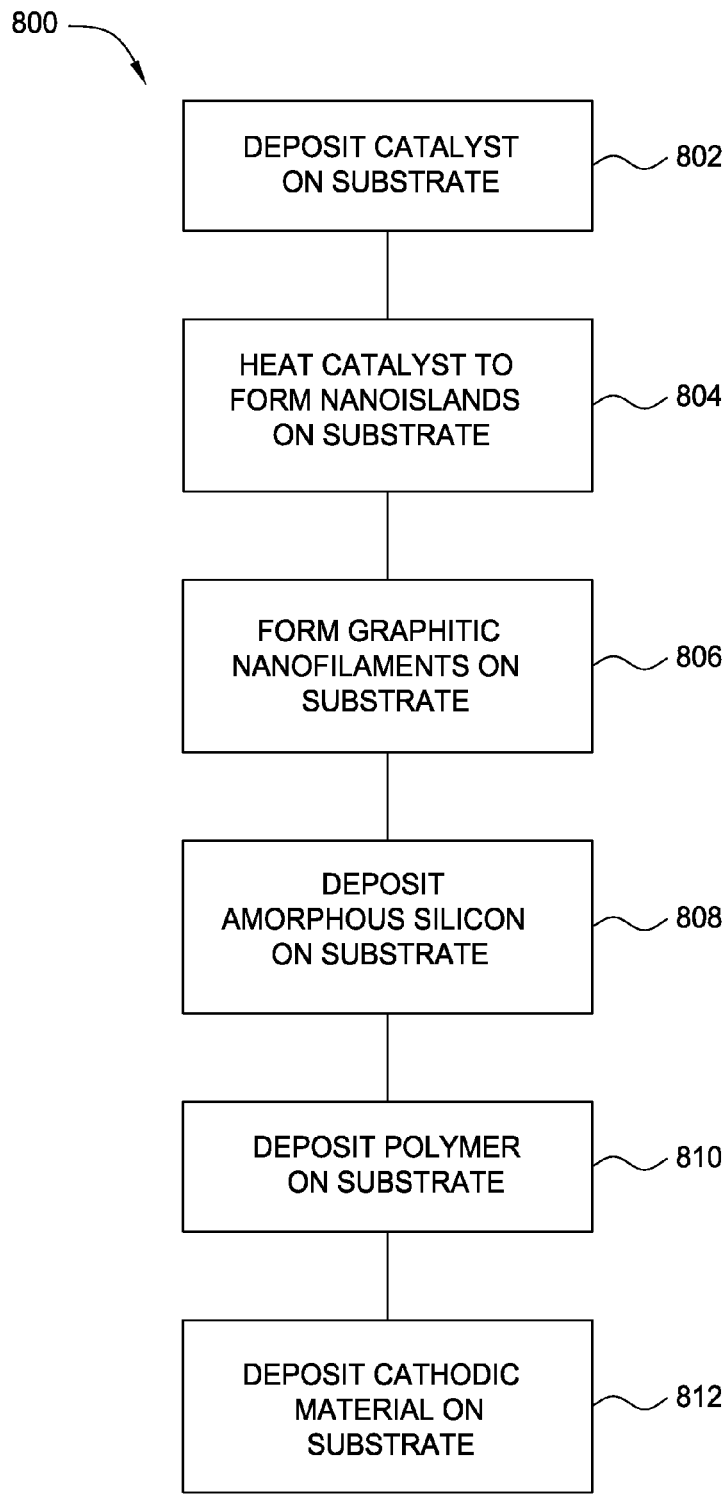
FIG. 8 is a process flow chart summarizing one embodiment of a method for forming a high surface area electrode according to embodiments described herein.

Next, during block 804, as illustrated in FIG. 7C, the deposited catalyst material 702 is further processed to form nanoislands 704 of catalyst material on the substrate S. In one embodiment, the processing step(s) used to form the nanoislands 704 includes heating the substrate S to a desired temperature for a desired period of time. In one embodiment, the temperature in the processing region may be constant or may be increased over time. In one embodiment, the temperatures in the processing region for forming the nanoislands may be between about 300° C. and about 1,000° C. In one embodiment, the temperatures in the processing region for forming the nanoislands may be between about 500° C. and about 800° C.

Figure 7D:
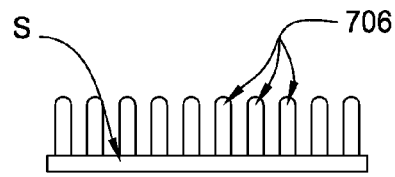

Next, during block 806, as illustrated in FIG. 7D, graphitic nanofilaments 706 are formed on the substrate S. By supplying a carbon containing precursor to the surface of the substrate S that contains the nanoislands 704, graphitic nanofilaments 706 can be formed on a surface of the substrate S. In one embodiment, the graphitic nanofilaments 706 comprise carbon nanotubes or nanofibers that are single-walled or multi-walled as described above. In one embodiment, the carbon containing precursor is selected from a group of carbon source gases comprising: xylene, ethylene, propylene, acetylene, benzene, toluene, ethane, methane, butane, propane, hexane, methanol, ethanol, propanol, isopropanol, carbon monoxide, acetone, oxygenated hydrocarbons, low-molecular-weight hydrocarbons, and combinations thereof. In some embodiments, the process to form the nanotubes may be a plasma enhanced chemical vapor deposition (PECVD) process. In further embodiments, the process to form the nanotubes 706 may be a hot-wire chemical vapor deposition process (HWCVD) or an iCVD process.

Figure 7E:
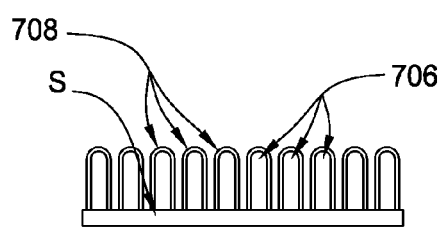

Next, during block 808, as illustrated in FIG. 7E, a silicon containing layer 708 is deposited over the graphitic nanofilaments 706 formed during block 806. In one embodiment, the silicon containing layer is an amorphous silicon layer that is between about 0.5 nm and about 10 nm thick. In one embodiment, an amorphous silicon layer is formed over the graphitic nanofilaments 706 using a HWCVD process. The HWCVD process generally uses a hot filament (usually tungsten or tantalum) to "crack" the reactive gas components (e.g., silane and hydrogen) into atomic radicals. The hot filament is typically maintained at a surface temperature greater than 1500° C. The reactive species, after passing across the surface of the hot filament, are transported through a processing region to the substrate in a low pressure ambient which enables a high deposition rate without gas-phase particle formation. In one embodiment, as shown in FIG. 7E, an amorphous silicon layer 708 is deposited and conformably coats the graphitic nanofilaments 706. Silicon-containing gases for forming the amorphous silicon layer on the graphitic nanofilaments include, for example, hydrogen ($H_2$), silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof.

Figure 7F:
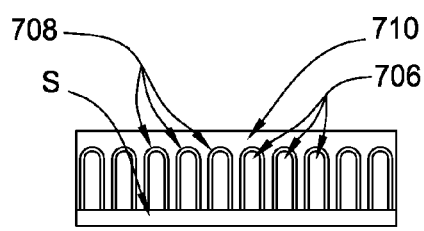

Next, during block 810, as illustrated in FIG. 7F, a polymeric layer is deposited over the silicon containing layer formed during block 808. In one embodiment, after the amorphous silicon 708 is deposited on the surface of the substrate, a polymeric material 710, such as a polytetrafluoroethylene (PTFE), is deposited thereon. The polymeric material 710 is generally used to provide a dielectric barrier and/or encapsulate both the graphitic nanofilaments 706 and the amorphous silicon layer 708. In one embodiment, the formed layer of polymeric material 710 is porous. In one embodiment, the polymeric material 710 is deposited on the amorphous silicon 708 and graphitic nanofilaments 706 using an initiated chemical vapor deposition (iCVD) process. The iCVD process generally involves the vapor phase delivery of both initiator species and monomers into a processing region that is maintained in a vacuum state. In one embodiment, the iCVD process is performed at using a low temperature between about 300° C. and 450° C., such as about 400° C.

Figure 7G:
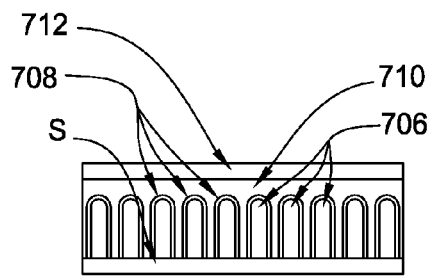

During block 812, as illustrated in FIG. 7G a cathodic layer 712 of material is deposited on top of the polymeric material 710, to form a cathode and complete the composite material structure. In one embodiment, the cathodic layer 712 is a lithium (Li) based material, such as lithium transition metal oxides, such as $LiMn_2O_4$, $LiCoO_2$ and/or combinations of Ni and Li oxides. In one embodiment, the cathodic material includes a series of layers which include a lithium containing layer and a metal layer. In one example, the metal layer includes but is not limited to include aluminum, stainless steel, and nickel. The cathodic material may be deposited using at least one of a PVD, PECVD, CVD, iCVD, or HWCVD process.

Figure 10:
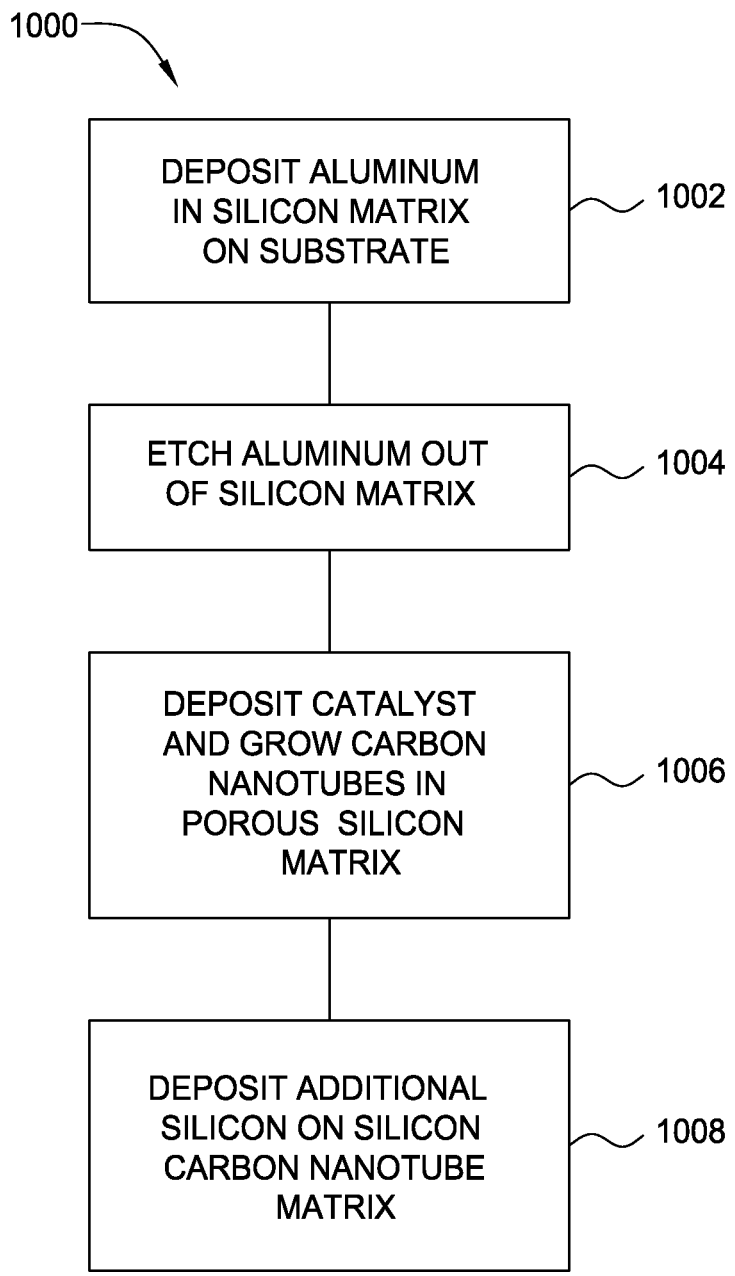
FIG. 10 is a process flow chart summarizing one embodiment of a method for forming a high surface area electrode according to embodiments described herein.

FIGS. 9A-9D are schematic isometric views of one embodiment of a high surface area electrode formed in accordance with embodiments described herein. FIG. 10 is a process flow chart 1000 summarizing one embodiment of a method for forming a high surface area electrode according to embodiments described herein. The process sequence found in FIG. 10 corresponds to the schematic isometric views of FIGS. 9A-9D. The composite materials may be formed on discrete substrates S as shown in FIG. 9A or on a web in a roll-to-roll process. Such a substrate S is shown in FIG. 9A. The substrate S can be made of, but is not limited to: glass, silicon (Si) or metal such as aluminum (Al), stainless steel, or copper (Cu). In one embodiment, the substrate S may be relatively non-flexible when provided as a discrete substrate, but relatively flexible when supplied as a web (for example, aluminum, stainless steel, or copper foil). In another embodiment, the substrate may be flexible when provided as a discrete substrate.

At block 1002, as shown in FIG. 9B, a substrate S is positioned in a chamber and a layer 902 of a silicon (Si) matrix 904 with an Aluminum (Al) phase 906 segregated therein is deposited on the substrate S. In one embodiment, the layer 902 is deposited using a PVD sputtering process. In one embodiment, a target of $Al_{56}Si_{44}$ is positioned in a processing region. A power source is connected to the target so that a cathodic DC and/or RF bias can be applied to the target so that the layer 902 can be deposited on the surface of the substrate S. The plasma generated by the bias applied to the target causes atoms from the target surface to be removed, and be deposited on the exposed surfaces of the substrate S. In one embodiment, the power supplied by the power source is between about 100 W and about 200 W. In one embodiment, the substrate S may be heated to a substrate temperature of between about 50° C. and about 500° C. In one embodiment the substrate S is heated to a substrate temperature between about 100° C. and about 200° C. In another embodiment, the substrate S is heated to a temperature less than 150° C. As layer 902 is sputtered onto the substrate S, the aluminum phase 906 is segregated in the silicon matrix 904.

After the formation of layer 902 on the substrate S, process 1000 proceeds to block 1004. In block 1004, the aluminum is etched out of the silicon matrix. In one embodiment, the etching of the aluminum is performed using a wet etch process. After the aluminum has been etched out of the silicon matrix, the resulting structure is as is shown in FIG. 9C. The substrate S includes a porous silicon layer 908 disposed thereon. The porous silicon layer 908 is formed by removing the aluminum phase 906 from the silicon matrix 904 to form a plurality of pores 910. The distance between the plurality of pores 910 can be tuned.

Next, during block 1006, as illustrated in FIG. 9D, carbon nanotubes (CNT) 912 are deposited in the pores 910 of the porous silicon layer 908. In one embodiment, the CNTs 912 are formed in the porous silicon layer 908 using a CVD process. The CNTs 912 can be grown in the porous silicon layer 908 by first depositing and heating catalyst material to form nanoislands of catalyst material in the pores 910 of the porous silicon layer 908. The gasses for forming the catalyst material on the substrate and the gasses for forming the CNTs may be sequentially supplied, or may be simultaneously provided (co-flowed). By first providing the gasses required to form the catalyst, then heating the catalyst to form the nanoislands, and following with the gasses to form the CNTs, CNTs that are relatively free of catalyst particles can be formed. When the gasses for forming the catalyst and the CNTs are simultaneously provided, some amount of catalyst particles may be present on the resulting CNTs. In some applications, a small amount of contamination is acceptable. Thus, the increased substrate throughput of a co-flowed method may be desirable. The CNTs may be formed using any of the processes described herein as well as other known processes. The CNTs provide excellent electrical conductivity for electrons as well as supporting the structural integrity of the structure.

Figure 11:
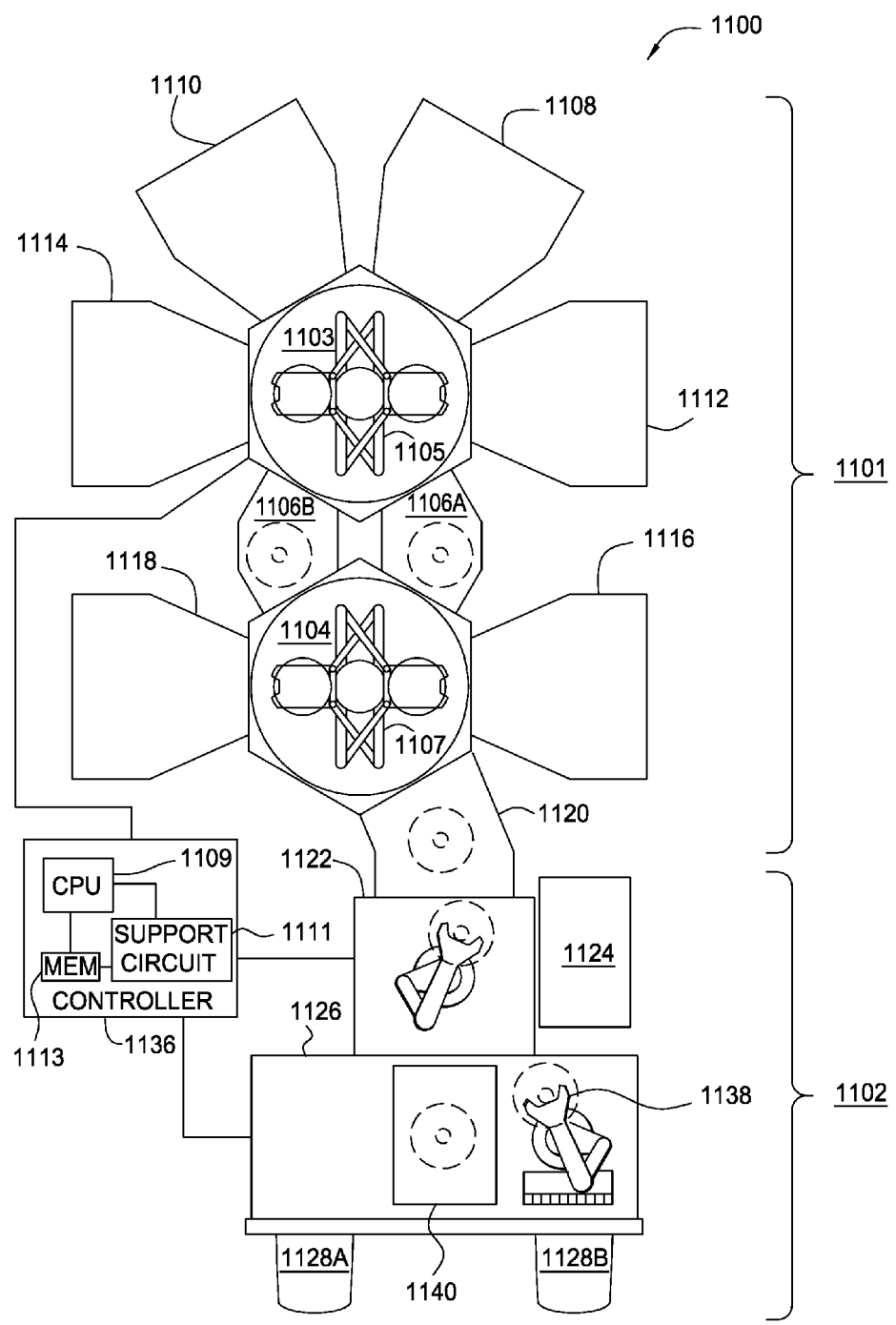
FIG. 11 is a schematic plan view of one embodiment of a processing system that may be used to form the high surface area electrodes discussed herein.

After the deposition of CNTs in the silicon matrix, in some embodiments, additional silicon is deposited at block 1008 of process 1000, on the structure shown in FIG. 9D. The additional Si may be deposited using HWCVD or other suitable processes. In one embodiment, the silicon containing layer is an amorphous silicon layer that is between about 10 nm and about 1,000 nm thick. Referring to FIG. 11, a chamber is configured and adapted to deposit the amorphous silicon on the Si/CNT matrix (904 and 912 of FIG. 9D) using a HWCVD process. Silicon-containing gases for forming the amorphous silicon layer on the graphitic nanofilaments include, for example, hydrogen ($H_2$), silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof.

The structure shown in FIG. 9D is advantageously used in the formation of an electrode structure for energy storage devices. The Si-CNT nanocomposite formed by depositing a plurality of nanotubes 912 in the pores 910 of the silicon matrix 904 provides several advantages. One such advantage is that the partial exposure of the porous silicon allows for higher current capacity in excess of 3400 mAh/g. Another advantage is the ability of the structure to accommodate volume expansion (such as thermal expansion) through the presence of the pores 910. In addition, the nature of the CNTs when incorporated in the inventive structure provide for prolonged cycle life, excellent structural integrity, and excellent electronic conduction pathways. The scalability of these nanostructures will also reduce costs of the final products in both electric vehicle (EV) and consumer electronic markets.

FIG. 11 is a schematic plan view of one embodiment of a processing system (e.g., cluster tool 1100) that may be used to form the high surface area electrodes discussed herein. The cluster tool 1100 includes a vacuum-tight processing platform 1101, a factory interface 1102, and a system controller 1136. The platform 1101 comprises a plurality of processing modules 1108, 1110, 1112, 1114, 1116, 1118, 1124 and at least one load-lock chamber (a load-lock chamber 1120 is shown), which are coupled to vacuum substrate transfer chambers 1103, 1104. The factory interface 1102 is coupled to the transfer chamber 1104 by the load lock chamber 1120.

In one embodiment, the factory interface 1102 comprises at least one docking station 1126, at least one substrate transfer robot 1138, at least one substrate transfer platform 1140, at least one precleaning chamber 1124, and a precleaning robot 1122. In one embodiment, the docking station 1126 is configured to accept at least one front opening unified pod (FOUP). Two FOUPs 1128A, 1128B are shown in the embodiment of FIG. 11, but any number of FOUPs may be provided within the physical limits of the docking station 1126. The substrate transfer robot 1138 is configured to transfer the substrate from the factory interface 1102 to the precleaning chamber 1124 wherein a precleaning process may be performed. The precleaning robot 1122 is configured to transfer the substrate from the precleaning chamber 1124 to the loadlock chamber 1120. Alternatively, the substrate may be transferred from the factory interface 1102 directly to the loadlock chamber 1120, by-passing the precleaning chamber 1124.

The loadlock chamber 1120 has a first port coupled to the factory interface 1102 and a second port coupled to a first transfer chamber 1104. The loadlock chamber 1120 is coupled to a pressure control system (not shown) which pumps down and vents the chamber 1120 as needed to facilitate passing the substrate between the vacuum environment of the transfer chamber 1104 and the substantially ambient (e.g., atmospheric) environment of the factory interface 1102.

The first transfer chamber 1104 has a first robot 1107 disposed therein. The first robot 1107 transfers substrates between the loadlock chamber 1120, the processing modules 1116 and 1118, and two substrate transfer platforms 1106A and 1106B. The second transfer chamber 1103 has a second robot 1105 disposed therein. The second robot 1105 transfers substrates between the two substrate transfer platforms 1106A and 1106B and the processing modules 1108, 1110, 1112 and 1114. The two substrate transfer platforms 1106A, 1106B are disposed between the transfer chamber 1104 and the transfer chamber 1103 to facilitate transfer of the substrate between the robot 1105 and the robot 1107. The platforms 1106A, 1106B can either be open to the transfer chambers 1103, 1104 or be selectively isolated (i.e., sealed) from the transfer chambers 1103, 1104 to allow different operational pressures to be maintained in each of the transfer chambers 1103, 1104.

In one embodiment, the processing chambers coupled to the first transfer chamber 1104 may be a third hot-wire CVD (HWCVD) chamber 1118, a physical vapor deposition (PVD) or chemical vapor deposition (CVD) chamber 1116, for performing a CVD process such as hot-wire CVD (HWCVD). The processing chambers coupled to the second transfer chamber 1103 may be a first PVD chamber 1112, a second PVD chamber 1114, a first HWCVD chamber 1110, and a second HWCVD chamber 1108. Suitable CVD, PVD, HWCVD and degas processing chambers are available from Applied Materials, Inc., located in Santa Clara, Calif.

The system controller 1136, used to control the various components in the tool 1100, generally has a memory 1113, a central processing unit (CPU) 1109 and support circuits 1111. The system controller 1136 is utilized to control the process sequence of the chambers, regulating the gas flows from gas sources and power application from power sources into the chambers. The system controller 1136 is coupled to the integrated processing tool 1100. The system controller 1136 controls the operation of the tool 1100 using a direct control of the process chambers of the tool 1100 or alternatively, by controlling the computers (or controllers) associated with the process chambers and tool 1100. In operation, the system controller 1136 enables data collection and feedback from the respective chambers and system to optimize performance of the tool 1100.

Figure 12:
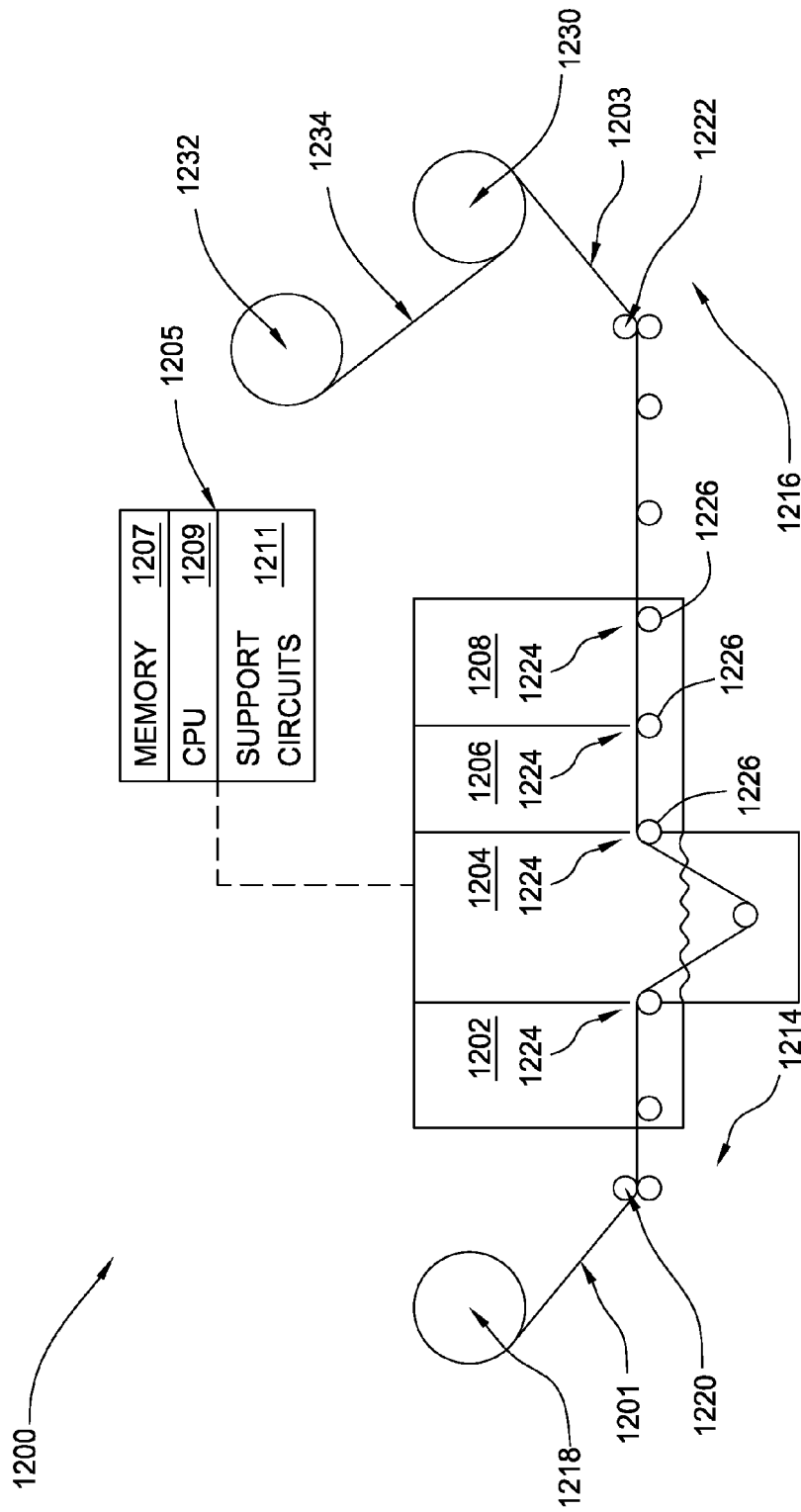
FIG. 12 is a schematic side view of one embodiment of an apparatus for forming a high surface area electrode on substrates in the form of a web, showing the various chambers for forming the high surface area electrode.

FIG. 12 is a schematic side view of one embodiment of an apparatus 1200 for forming a high surface area electrode on substrates in the form of a web, showing the various chambers for forming the high surface area electrode. The substrate in FIG. 12 is in the form of a continuous web 1201 of material. The apparatus 1200 includes various chambers 1202, 1204, 1206, and 1208 for forming the high surface area electrodes. The apparatus 1200 has a first end 1214 where a supply roll 1218 stores the unprocessed substrate(s), web 1201, and feeds the web 1201 into the first chamber 1202. The apparatus 1200 has a second end 1216 where a take-up roll 1230 receives and stores the processed substrate(s), web 1203, with the high surface area electrode materials deposited thereon. At the first end 1214 a first diverter roller 1220 receives web 1201 from the supply roll 1218, and diverts the web 1201 into the first chamber 1202. At the second end 1216, a second diverter roller 1222 receives the processed web 1203 from the final chamber 1208 and diverts it to the take-up roll 1230. In some embodiments, a roll 1232 of a protective web of material 1234 may be routed unto take-up roll 1230. The web of protective material 1234 isolates adjacent layers of processed web 1203, to thereby protect the web 1203 while it is stored and or transported on roll 1230.

A series of substrate transfer ports 1224 are provided at the entrance and exit of the apparatus 1200 and between each of the chambers 1202, 1204, 1206, and 1208 to allow the substrates to pass between chambers, while maintaining the required environment within each chamber during processing. A series of rollers 1226 supports the web 1201 of material as it is guided through the various chambers. In some embodiments, a drive belt (not shown) may be included to form a conveyor to provide additional support to the web 1201 between the rollers 1226. The rollers 1226 may be mechanically driven by a common drive system (not shown) such that they are controlled in unison, thereby avoiding wrinkling or stretching of the web 1201. The rollers 1226 may advance the web 1201 into the subsequent chambers, based on commands received by a drive mechanism 1314 (FIG. 13) from the support circuits 1211 (FIG. 12) of the system controller 1205. While in the embodiment of FIG. 12, four chambers are shown, more or less chambers may be provided depending on the number of processes and the required equipment for each process. In one embodiment, the apparatus 1200 also contains at least one additional chamber (not shown) at either end 1214, 1216 of the system that act as a load lock to provide a buffer between the environment external to the apparatus 1200 and the processing regions of the chambers 1202-1208. The various drives for the supply roll 1218, take-up roll 1230, rollers 1226, ports 1224 and other system actuators are provided control signals from a system controller 1205. The controller 1205 has a memory 1207, a central processing unit (CPU) 1209 and support circuits 1211 that are coupled to the apparatus 1200. The controller 1205 is utilized to control the process sequence of the chambers, regulating the gas flows from gas sources and power application from power sources into the chambers. The CPU 1209 may be of any form of a general purpose computer processor that can be used in an industrial setting. The software routines can be stored in the memory 1207, such as random access memory, read only memory, floppy or hard disk drive, or other form of digital storage. The support circuits 1211 are conventionally coupled to the CPU 1209 and may comprise cache, clock circuits, input/output subsystems, power supplies, and the like. The software routines, when executed by the CPU 1209, transform the CPU into a specific purpose computer (controller) 1205 that controls the process chambers such that the processes are performed in accordance with the present invention. The software routines may also be stored and/or executed by a second controller (not shown) that is located remotely from the apparatus 1200.

Figure 13:
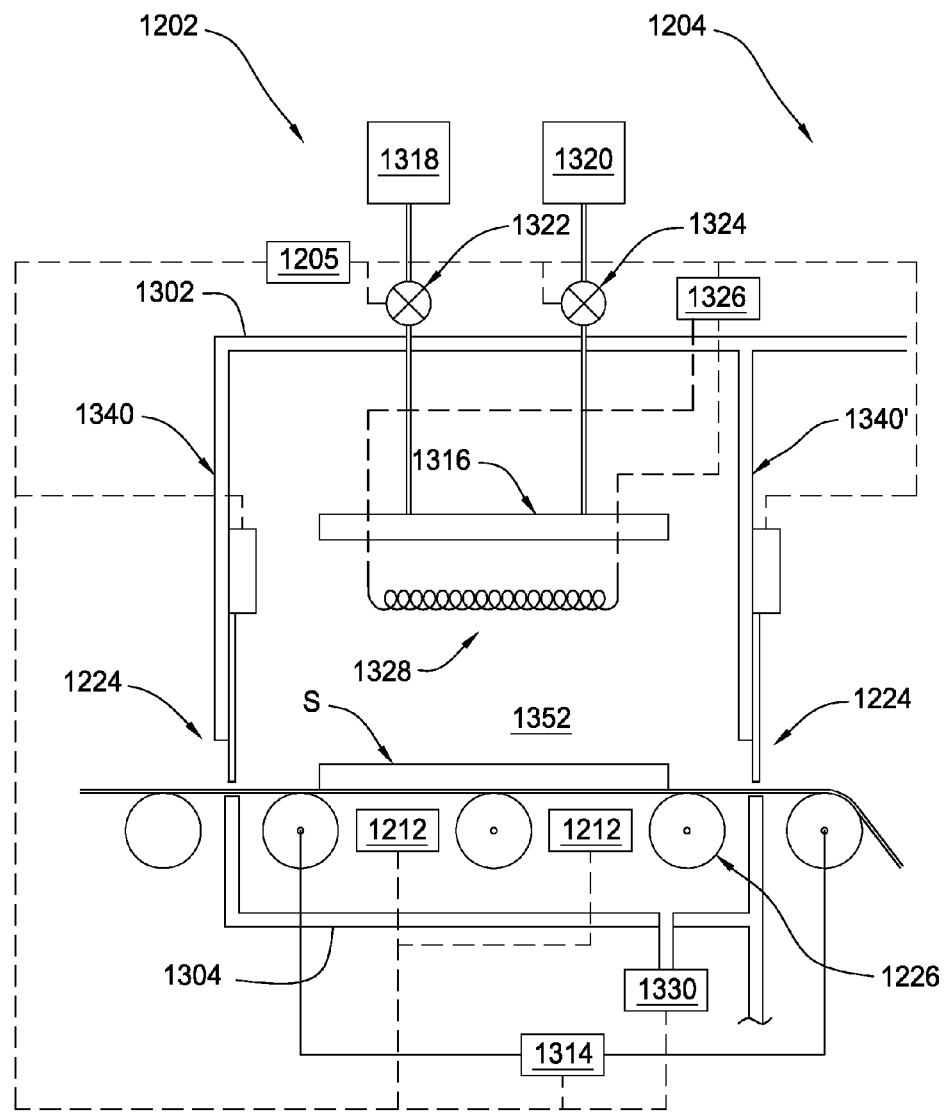
FIG. 13 is a schematic side view of one embodiment of a chamber for depositing amorphous silicon on a substrate.

FIG. 13 is a schematic side view of one embodiment of a chamber 1202 for depositing silicon on a substrate. During block 604, as illustrated in FIG. 2B and 13, a silicon containing layer is deposited over the web 1201. In one embodiment, the silicon containing layer is an amorphous silicon layer that is between about 100 nm and about 3 μm thick. Although FIG. 2 shows current collector 111 as a discrete substrate, it should be understood that in certain embodiment, current collector 111 may be replaced by a web such as web 1201. In one embodiment, the amorphous silicon layer is formed over the web 1201 using a hot wire chemical vapor deposition (HWCVD) process. In one embodiment, as shown in FIG. 13, a chamber 1202 is configured and adapted to deposit the amorphous silicon on the web 1201 using a HWCVD process. The HWCVD process generally uses a hot filament (usually tungsten or tantalum) to "crack" the reactive gas components (e.g., silane and hydrogen) into atomic radicals. The hot filament is typically maintained at a surface temperature significantly higher than 1500° C. The reactive species, after passing across the surface of the hot filament, are transported through a processing region 1352 to the substrate in a low pressure ambient which enables a high deposition rate without gas-phase particle formation. In one example, an amorphous silicon layer 204 is deposited and coats the conductive web 1201. To accomplish this, the chamber 1202 includes a showerhead 1316 that receives process gasses from one or more gas sources 1318, 1320 via valves 1322, 1324, respectively. In one embodiment, the one or more gas sources comprise a silicon containing gas source. The valves 1322, 1324 are controlled by signals received from the support circuits 1211 of the system controller 1205. The gasses supplied by the shower head 1316, for forming amorphous silicon on the web 1201 include, for example, hydrogen ($H_2$), and silicon containing gases, such as silane ($SiH_4$), disilane ($Si_2H_6$), silicon tetrafluoride ($SiF_4$), silicon tetrachloride ($SiCl_4$), and/or dichlorosilane ($SiH_2Cl_2$). To assist in the CVD process, a resistive wire 1328 is placed in close proximity to the web 1201. Electrical current is supplied to the wire 1328 by a power supply 1326, based on signals received from the support circuits 1211 of the system controller 1205. The electrical current heats the wire 1328 to form the amorphous silicon 204 on the conductive web 1201. In embodiments requiring heating of the web 1201, one or more heating elements 1212 may be provided.

In this embodiment, the chamber 1202 includes a first wall 1340 facing the first end 1214 of apparatus 1200 and a second wall 1340' between chamber 1202 and chamber 1204. While second wall 1340' is shown as a shared wall between chambers 1202 and 1204, double walls may be used if required (e.g., to provide greater insulation between chambers). The chamber 1202 also includes a top 1302, that may be a common one-piece top for all of the chambers as shown, or each chamber could be provided with a separate top. As with the top 1302, chamber bottom 1304 may be a common one-piece bottom for all of the chambers as shown, or each chamber could be provided with a separate bottom.

In one embodiment, a pumping device 1330 is coupled to the processing region 1352 to evacuate and control the pressure therein. The pumping device 1330 may be a conventional rough pump, roots blower, turbo pump or other similar device that is adapted control the pressure in the processing region 1352. In one embodiment, the pressure level of the processing region 1352 of the chamber 1202 may be maintained at less than about 760 Torr. In one embodiment, the pressure level of the processing region 1352 of the chamber 1202 may be maintained at about 1 Torr or less. In another embodiment, the pressure level within the chamber 1202 may be maintained at about $10^{-3}$ Torr or less. In yet another embodiment, the pressure level within the chamber 1202 may be maintained at about $10^{-3}$ Torr to about $10^{-7}$ Torr.

Figure 14:
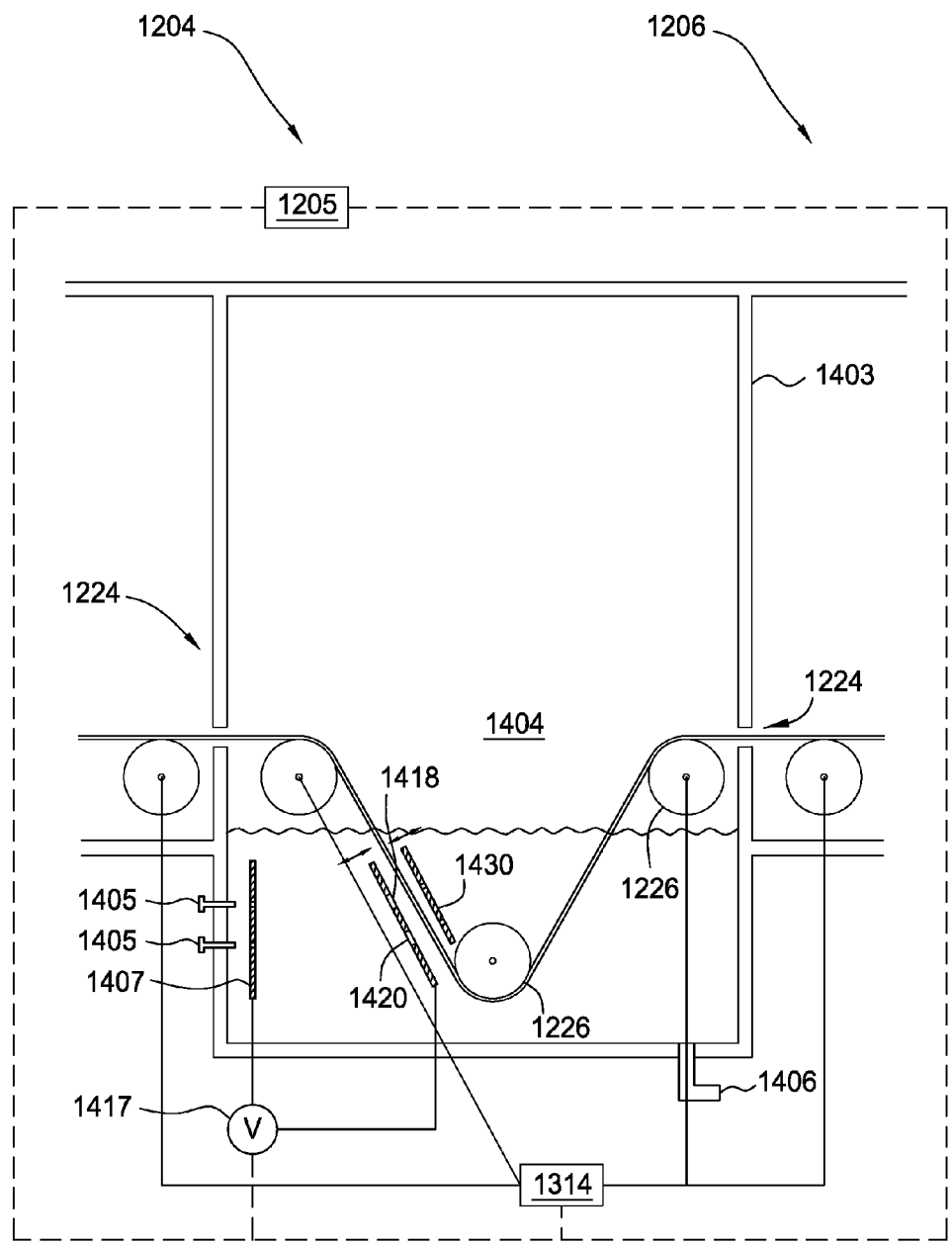
FIG. 14 is a schematic side view of one embodiment of a chamber for performing an anodization process on a substrate.

FIG. 14 is a schematic side view of one embodiment of an anodization chamber 1204 for performing an anodization process on a substrate. During block 606, as illustrated in FIG. 2C and 13, an interconnected porous silicon structure 206 is formed. The anodization chamber 1204 is configured to form pores in the amorphous silicon layer 204. The anodization chamber 1204 generally comprises a chamber body 1403 defining a processing volume 1404. The processing volume 1404 is in fluid communication with one or more inlet jets 1405 configured to dispense an anodization solution in the processing volume 1404. The processing volume 1404 is also in fluid communication with a drain 1406 configured to remove the plating solution from the processing volume 1404.

The anodization chamber 1204 also comprises an anode assembly 1420 disposed in the processing volume 1404. In one embodiment, the anode assembly 1420 is disposed in a substantially vertical orientation. In one embodiment, the anode assembly 1420 may contain a plurality of holes 1418 that allow the anodization bath passing from the inlet jets 1405 to have a uniform flow distributed across a surface of the web 1201.

The anode assembly 1420 may be formed from material that is consumable during the electroplating reaction, but is more preferably formed from a non-consumable material. A non-consumable electrode may be made of a conductive material that is not etched during the process, such as platinum or ruthenium coated titanium. In one embodiment, the anode assembly 1420 is horizontally movable.

In one embodiment, the anodization chamber 1204 comprises a thrust plate 1430 disposed in the processing volume 1404, substantially parallel to the anode assembly 1420. The thrust plate 1430 is configured to hold a portion of the web 1201 in a position relative to the anode assembly 1420 during the anodization process. The thrust plate 1430 is positioned on a backside of the web 1201 and the anode assembly 1420 is positioned on a front side of the flexible web 1201.

In one embodiment, the thrust plate 1430 is horizontally movable. During transferring stage, the thrust plate 1430 is moved away from the flexible web 1201 and neither the anode assembly 1420 nor the thrust plate 1430 is in contact with the flexible web 1201. Before processing, at least one of the thrust plate 1430 and the anode assembly 1420 is moved towards the other sandwiching the flexible web 1201 in between. The thrust plate 1430 ensures that the flexible web 1201 is substantially parallel to the anode assembly 1420 and in a desired distance from the anode assembly 1420. A power source 1417 is coupled between the anode assembly 1420 and a cathode assembly 1407 to provide electric bias for anodization process.

Figure 15A:
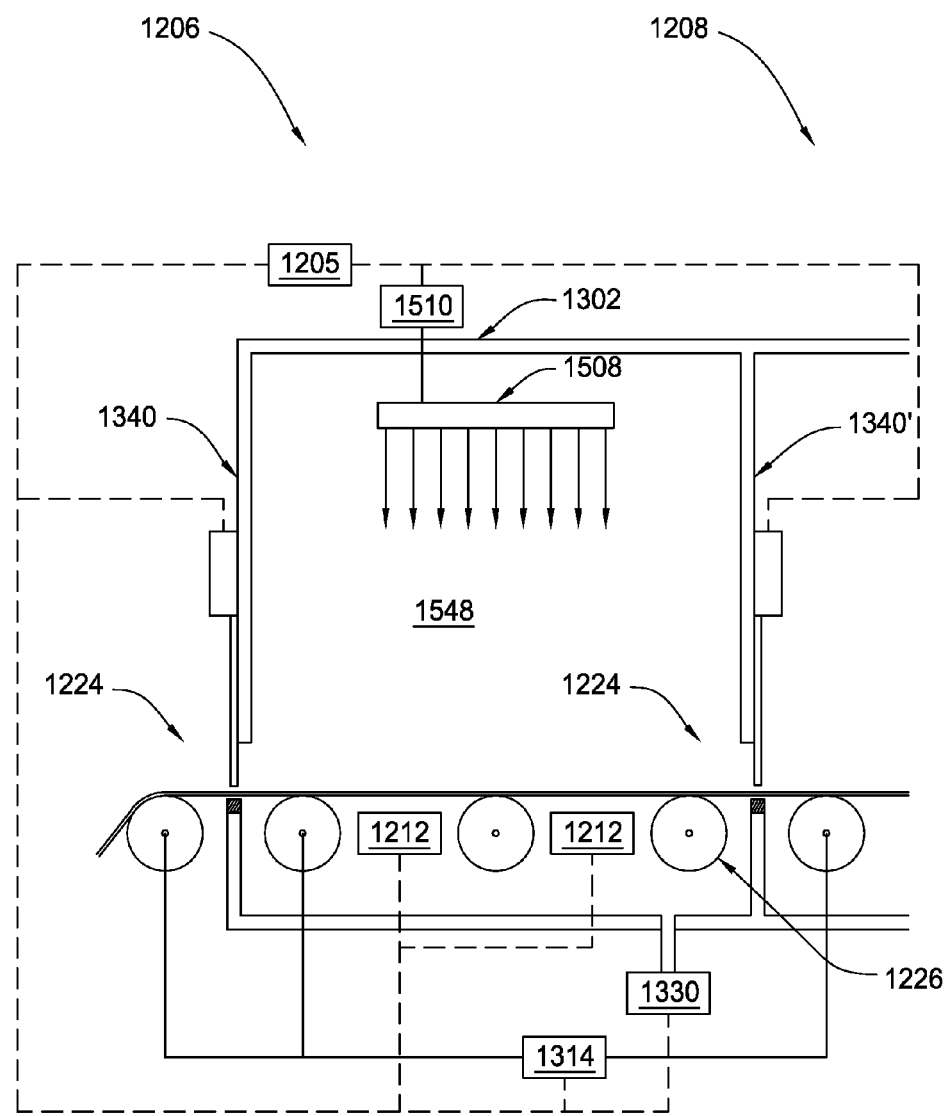
FIG. 15A is a schematic side view of one embodiment of a chamber for depositing catalyst material on a substrate.

FIG. 15A is a schematic side view of one embodiment of a chamber 1206 for depositing catalyst material on a substrate. During block 608, an optional layer of catalytic material is deposited over the porous amorphous silicon structure prior to the formation of carbon nanotubes inside pores of the porous amorphous silicon structure. The catalytic material can be formed of, but is not limited to iron (Fe); cobalt (Co); nickel (Ni); alloys of Fe, Co and Ni; Fe polymer; Co polymer; and Ni polymer. The layer of catalytic material may be deposited on the substrate S using a number of methods including a physical vapor deposition (PVD) method such as sputtering, or a chemical vapor deposition (CVD) method.

In one embodiment, a chamber 1206 of FIG. 15A, is configured and adapted to deposit the catalyst material using a sputtering deposition process. A target 1508 of the catalyst material is provided in the chamber 1206. A power source 1510 is connected to the target 1508 so that a cathodic DC and/or RF bias can be applied to the target 1508 so that the catalytic material can be deposited over the web 1201. The plasma generated by the bias applied to the target 1508 causes atoms from the target surface to be removed, and deposited inside the pores of the interconnected porous amorphous silicon structure. In embodiments requiring heating of the substrates, one or more heating elements 1212 may be provided. The heating elements 1212 may comprise resistive heating elements, induction coils, or other heating means.

Figure 15B:
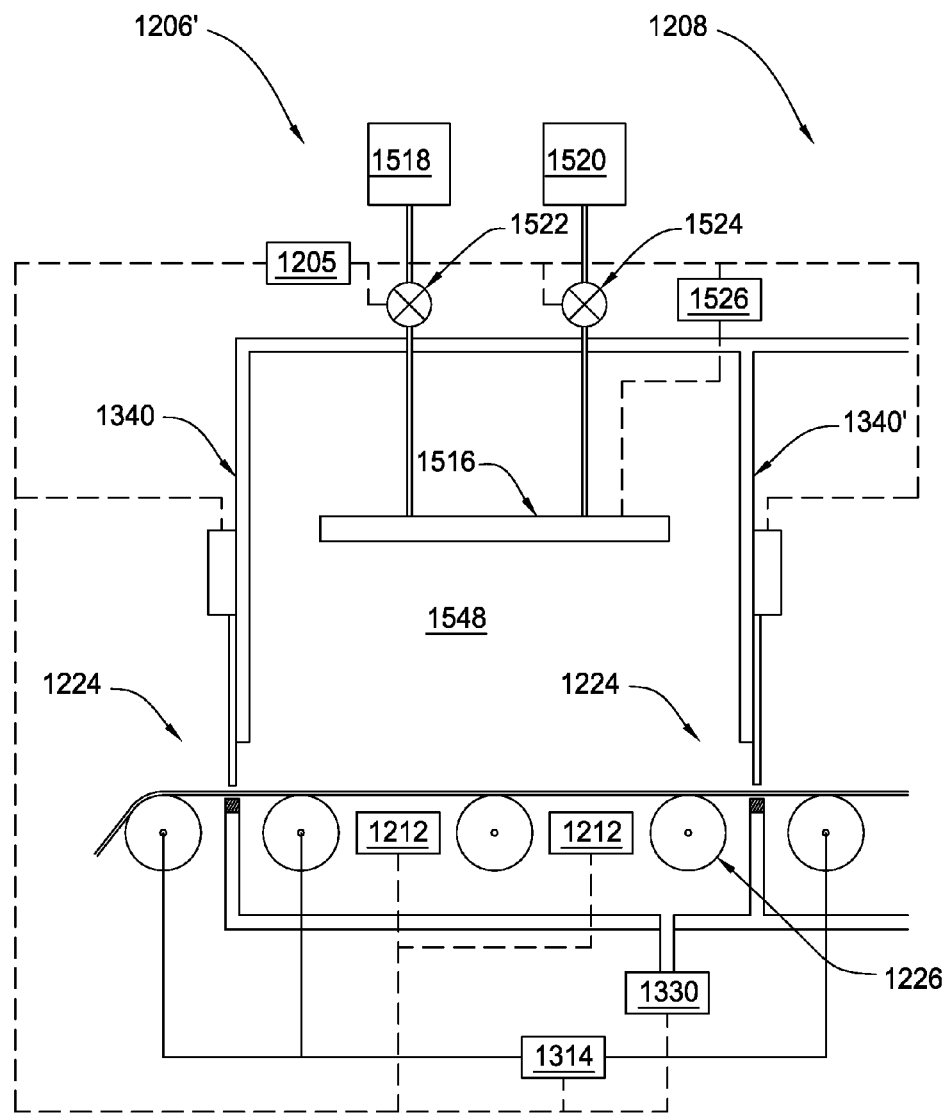
FIG. 15B is a schematic side view of another embodiment of a chamber for depositing catalyst material on a substrate.
Figure 16:
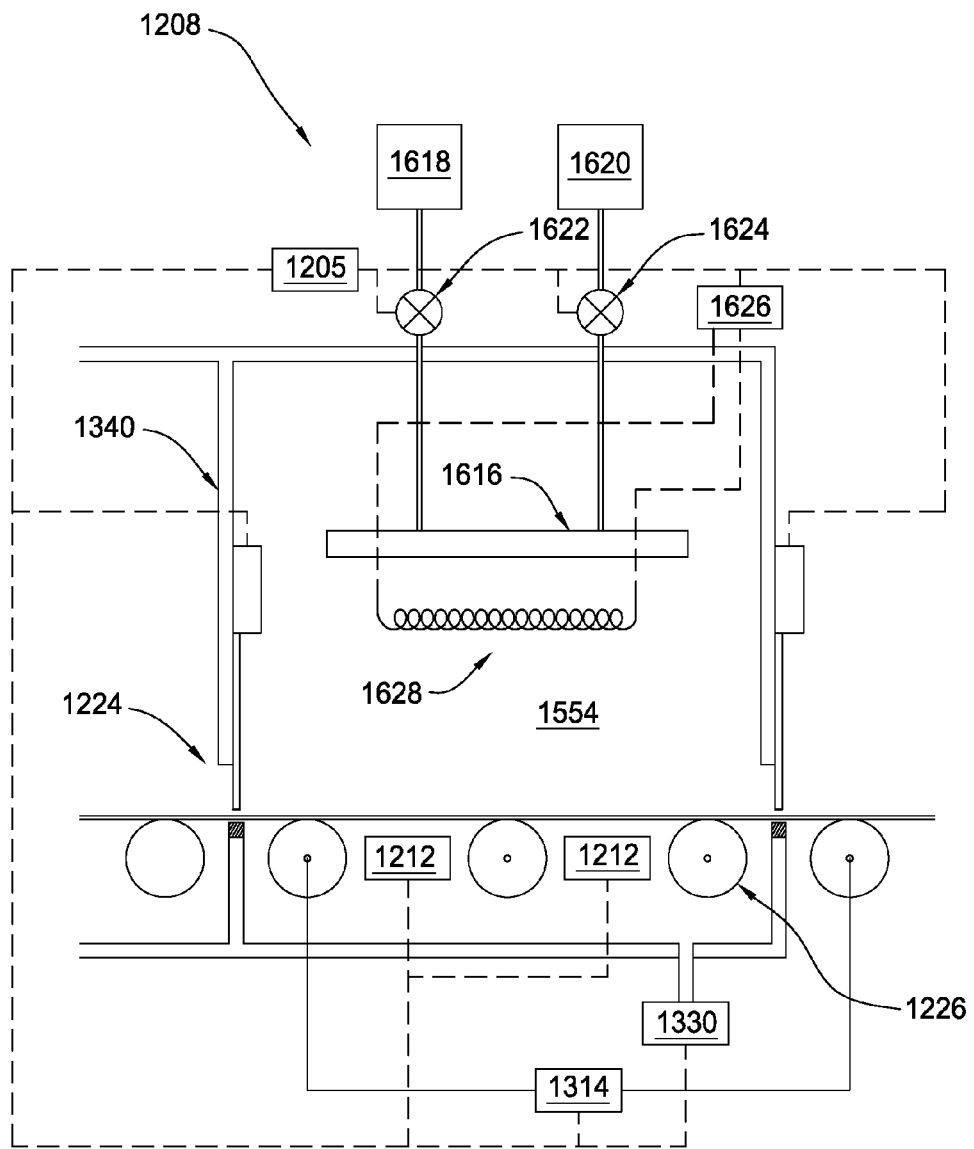
FIG. 16 is a schematic side view of one embodiment of a chamber for depositing carbon nanotubes on a substrate.

FIG. 15B is a schematic side view of another embodiment of a chamber 1206' for depositing catalyst material on a substrate. In another embodiment, a chamber 1206' of FIG. 15B is used to deposit catalyst material on the substrates S positioned in a processing region 1548 using a chemical vapor deposition (CVD) process. One will note that the components found in chamber 1206' (and the other chambers as described below) are generally similar to the components founds in chamber 1202 in FIG. 13, and thus have the same reference designators, and are not described with reference to FIG. 15B. In chamber 1206', process gasses are provided to a showerhead 1516 from one or more gas sources 1518, 1520 via valves 1522, 1524, respectively. Valves 1522, 1524 are controlled by signals received from the support circuits 1211 of the system controller 1205. The process gasses provided to the showerhead 1516 include gasses used to form the catalytic material, such as metal organic precursors. While in this embodiment, two gas sources 1518, 1520 are shown, a single gas source or a plurality of gas sources may be provided depending on the number and combination of gases used. To improve the film quality, increase the deposition rate and/or film uniformity, the CVD process may be enhanced by applying a bias to the showerhead 1516 and/or the web 1201. In one embodiment, a power supply 1526 is configured to RF bias the showerhead 1516 based on signals received from the support circuits 1211 of the system controller 1205. The applied voltage may be RF, DC or AC depending on system requirements. In another embodiment, an inductively coupled plasma may also be formed in the processing region 1548 by use of the power supply 1526 and FIG. 16 is a schematic side view of one embodiment of a chamber 1208 for depositing carbon nanotubes on a substrate positioned in a processing region 1554. During block 608, as illustrated in FIG. 2D carbon nanotubes are formed inside the pores of the porous amorphous silicon structure. In one embodiment, the carbon nanotubes are formed in the pores of the porous amorphous silicon structure using a hot wire chemical vapor deposition (HWCVD) process. In one embodiment, as shown in FIG. 16, the chamber 1208 is configured and adapted to deposit the carbon nanotubes on the substrate using a HWCVD process as described above. To accomplish this, the chamber 1208 includes a showerhead 1616 that receives process gasses from one or more gas sources 1618, 1620 via valves 1622, 1624, respectively. In one embodiment, the one or more gas sources comprise a carbon containing source gas. The valves 1622, 1624 are controlled by signals received from the support circuits 1211 of the system controller 1205. To assist in the CVD process, a resistive wire 1628 is placed in close proximity to the web 1201. Electrical current is supplied to the wire 1628 by a power supply 1626, based on signals received from the support circuits 1211 of the system controller 1205. The electrical current heats the wire 1628 to form the carbon nanotubes inside the pores of the porous amorphous silicon structure.

EXAMPLES

The following hypothetical non-limiting examples are provided to further illustrate embodiments described herein. However, the examples are not intended to be all inclusive and are not intended to limit the scope of the embodiments described herein.
Porous Si-CNT on a 300 mm Substrate:
With reference to FIG. 11 and FIGS. 9A-9D, the substrate S is transferred into the integrated processing tool 1100. The substrate is transferred into the first PVD chamber 1112 where copper is deposited on the substrate S using a PVD sputtering process. The substrate S is transferred to the second PVD chamber 1114 where the silicon (Si) matrix 904 with an aluminum (Al) phase 906 segregated therein is deposited on the substrate S as shown in FIG. 9B. Next, the substrate S is transferred to a wet etch chamber where the aluminum phase 906 is removed from the silicon matrix 904 using a wet etch process. The wet etch may be performed either in a dedicated wet etch chamber coupled with the integrated processing tool 1100 or the wet etch may be performed in a remote chamber. As shown in FIG. 9C, a plurality of pores 910 are formed after the aluminum has been etched out of the silicon matrix. The substrate S is transferred into the first HWCVD chamber 1110 where CNTs 912 are formed in the plurality of pores 910 as shown in FIG. 9D. After formation of the CNTs 912 the substrate S is transferred to the second HWCVD chamber 1108 where additional silicon is deposited on the structure shown in FIG. 9D.
Nanostructured Si-CNT on a 300 mm Substrate:
With reference to FIG. 11 and FIGS. 7D-7E, a substrate S is transferred into the integrated processing tool 1100. The substrate is transferred into the CVD chamber 1116 where a catalyst is deposited on the substrate S using a vapor phase CVD process. The substrate S is transferred into the first HWCVD chamber 1110 where CNTs 706 are formed on the substrate S. After formation of the CNTs 706 the substrate S is transferred to the second HWCVD chamber 1108 where additional silicon 708 is deposited on the structure as shown in FIG. 7E. Next, the substrate may be transferred to the third HWCVD chamber 1118 where a polymeric material 710 is deposited over the substrate S.

While the foregoing is directed to embodiments of the present invention, other and further embodiments of the invention may be devised without departing from the basic scope thereof, and the scope thereof is determined by the claims that follow.

The invention claimed is:

1. A method of forming a high surface area electrode for use in an energy storage device, comprising:
    forming an amorphous silicon layer on a current collector having a conductive surface, wherein the amorphous silicon layer has a bottom surface that contacts the current collector and an opposing top surface;
    immersing the amorphous silicon layer in an electrolytic solution to form interconnected pores in the amorphous silicon layer; and
    forming carbon nanotubes within the interconnected pores of the amorphous silicon layer,
        wherein the interconnected pores comprise a plurality of pores having a first diameter and extending from the top surface of the amorphous silicon layer toward the bottom surface of the amorphous silicon layer, and
        wherein at least one of the plurality of pores is divided into multiple pores as the plurality of pores extends toward the bottom surface of the amorphous silicon layer, each of the multiple pores having a second diameter less than the first diameter.

2. The method of claim 1, wherein the immersing the amorphous silicon layer in an electrolytic solution further comprises passing a current through the electrolytic solution with a metal electrode disposed in the electrolytic solution serving as an anode and the current collector having a conductive surface serving as a cathode.

3. The method of claim 1, wherein the immersing the amorphous silicon layer in an electrolytic solution further comprises:
    exposing the amorphous silicon layer to a first voltage to form the plurality of pores having a first diameter in the amorphous silicon layer; and
    decreasing the first voltage to a second voltage to split at least one of the plurality of pores into multiple pores having a second diameter that is smaller than the first diameter.

4. The method of claim 1, wherein the immersing the amorphous silicon layer in an electrolytic solution further comprises exposing the amorphous silicon layer to a voltage that decreases over time so that the size of the pores of the interconnected pores decreases as the voltage decreases.

5. The method of claim 1, wherein the amorphous silicon layer is formed using plasma enhanced chemical vapor deposition techniques or hot wire chemical vapor deposition techniques.

6. The method of claim 1, wherein the amorphous silicon layer is formed by depositing a nanocrystalline/polycrystalline layer and bombarding the nanocrystalline/polycrystalline layer with ions.

7. The method of claim 1, wherein the carbon nanotubes are formed using one or more catalyst materials selected from a group consisting of iron, cobalt, nickel, copper, silver, magnesium, ruthenium, rhodium, iridium, platinum, palladium, molybdenum, tungsten, chromium, and alloys and oxides thereof.

8. The method of claim 1, wherein each of the multiple pores having a second diameter less than the first diameter are formed at a series of branch structures as the interconnected pores extend toward the bottom surface of the amorphous silicon layer.

9. The method of claim 1, wherein the interconnected pores extend from the top surface of the amorphous silicon layer to a distance from about 10 nm to about 200 nm from the bottom surface of the amorphous silicon layer.

10. The method of claim 1, wherein some of the carbon nanotubes embedded within the interconnected pores of the amorphous silicon layer extend above the top surface of the amorphous silicon layer.

11. The method of claim 1, wherein the first diameter is from about 500 nm to about 1,000 nm and the second diameter is from about 300 to about 400 nm.

12. The method of claim 1, wherein the current collector having a conductive surface is a continuous web of conductive material comprising a material selected from the group consisting of copper (Cu), aluminum (Al), and nickel (Ni).

13. The method of claim 1, wherein the electrolytic solution comprises hydrofluoric acid and acetic acid.

14. The method of claim 1, wherein the carbon nanotubes are formed using thermal chemical vapor deposition ("CVD") techniques.

15. The method of claim 14, wherein the forming carbon nanotubes within the pores comprises flowing a carbon precursor selected from one or more gases selected from a group consisting of ethylene, propylene, acetylene, benzene, toluene, ethane, methane, butane, propane, hexane, octane, xylene, methanol, ethanol, propanol, isopropanol, carbon monoxide, acetone, oxygenated hydrocarbons, and combinations thereof.

16. The method of claim 15, wherein the carbon nanotubes are formed at a temperature from about 500° C. to about 800° C.

* * * * *